(12) United States Patent
Kurata et al.

(10) Patent No.: US 9,437,454 B2
(45) Date of Patent: Sep. 6, 2016

(54) WIRING BOARD, SEMICONDUCTOR DEVICE, AND MANUFACTURING METHODS THEREOF

(75) Inventors: Motomu Kurata, Isehara (JP); Shinya Sasagawa, Chigasaki (JP); Fumika Taguchi, Atsugi (JP); Yoshinori Ieda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 352 days.

(21) Appl. No.: 13/161,871

(22) Filed: Jun. 16, 2011

(65) Prior Publication Data

US 2011/0316057 A1    Dec. 29, 2011

(30) Foreign Application Priority Data

Jun. 29, 2010   (JP) .................................. 2010-148134

(51) Int. Cl.
  *H01L 29/10* (2006.01)
  *H01L 21/3213* (2006.01)
  *H01L 27/12* (2006.01)

(52) U.S. Cl.
  CPC ..... *H01L 21/32139* (2013.01); *H01L 27/1214* (2013.01); *H01L 27/1225* (2013.01)

(58) Field of Classification Search
  CPC ................... H01L 21/32139; H01L 24/1214; H01L 27/1225; H01L 27/112; H01L 27/11213; H01L 2924/1434; H01L 2924/1435; H01L 2924/1436
  USPC ............ 257/68, 71, 296, 300, 390, E27.084, 257/E27.098, E27.102, E27.104, E28.17, 257/E21.209, E21.646, E21.691, E21.665, 257/E33, 55, 59, 72, 88, E2.17, 887, 66
  See application file for complete search history.

(56) References Cited

U.S. PATENT DOCUMENTS 3,389,383 A * 6/1968 Burke et al. .................. 365/154
4,096,584 A * 6/1978 Owen et al. .................. 365/227

(Continued)

FOREIGN PATENT DOCUMENTS

CN    1613153    5/2005
EP    1385213 A  1/2004

(Continued)

OTHER PUBLICATIONS

Webster's Universal College Dictionary; Cramercy Books, New York, 1997, p. 632.*

(Continued)

*Primary Examiner* — Galina Yushina
(74) *Attorney, Agent, or Firm* — Eric J. Robinson; Robinson Intellectual Property Law Office, P.C.

(57) ABSTRACT

It is an object to reduce defective conduction in a wiring board or a semiconductor device whose integration degree is increased. It is another object to manufacture a highly reliable wiring board or semiconductor device with high yield. In a wiring board or a semiconductor device having a multilayer wiring structure, a conductive layer having a curved surface is used in connection between conductive layers used for the wirings. The top of a conductive layer in a lower layer exposed by removal of an insulating layer therearound has a curved surface, so that coverage of the conductive layer in the lower layer with a conductive layer in an upper layer stacked thereover can be favorable. A conductive layer is etched using a resist mask having a curved surface, so that a conductive layer having a curved surface is formed.

6 Claims, 10 Drawing Sheets

(56) References Cited

U.S. PATENT DOCUMENTS

| | | | |
|---|---|---|---|
| 4,633,438 A * | 12/1986 | Kume | G11C 11/405 257/632 |
| 4,838,992 A | 6/1989 | Abraham | |
| 5,247,204 A | 9/1993 | Yokoyama | |
| 5,480,839 A | 1/1996 | Ezawa et al. | |
| 5,731,856 A | 3/1998 | Kim et al. | |
| 5,744,864 A | 4/1998 | Cillessen et al. | |
| 5,892,562 A | 4/1999 | Yamazaki et al. | |
| 5,937,327 A | 8/1999 | Kawashima | |
| 5,940,705 A | 8/1999 | Lee et al. | |
| 6,127,702 A | 10/2000 | Yamazaki et al. | |
| 6,172,407 B1 * | 1/2001 | Gardner | H01L 21/28194 257/410 |
| 6,239,650 B1 * | 5/2001 | Tsay | G05F 3/205 327/534 |
| 6,275,901 B1 * | 8/2001 | Zager et al. | 711/128 |
| 6,294,274 B1 | 9/2001 | Kawazoe et al. | |
| RE37,882 E | 10/2002 | Ezawa et al. | |
| 6,563,174 B2 | 5/2003 | Kawasaki et al. | |
| 6,727,522 B1 | 4/2004 | Kawasaki et al. | |
| 6,927,117 B2 | 8/2005 | Cabral, Jr. et al. | |
| 6,940,152 B2 | 9/2005 | Arai | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,202,155 B2 | 4/2007 | Fukuchi | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,358,183 B2 | 4/2008 | Fukuchi | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,767,106 B2 | 8/2010 | Chang | |
| 7,847,287 B2 | 12/2010 | Kim et al. | |
| 7,855,369 B2 | 12/2010 | Takahashi | |
| 7,859,187 B2 | 12/2010 | Yamazaki et al. | |
| 8,053,171 B2 | 11/2011 | Maekawa et al. | |
| 8,115,201 B2 | 2/2012 | Yamazaki et al. | |
| 8,158,978 B2 | 4/2012 | Kim et al. | |
| 8,293,457 B2 | 10/2012 | Maekawa et al. | |
| 8,492,760 B2 | 7/2013 | Yamazaki et al. | |
| 8,624,252 B2 | 1/2014 | Maekawa et al. | |
| 8,748,879 B2 | 6/2014 | Yano et al. | |
| 2001/0046027 A1 | 11/2001 | Tai et al. | |
| 2002/0056838 A1 | 5/2002 | Ogawa | |
| 2002/0076907 A1 * | 6/2002 | Rodder | 438/586 |
| 2002/0132454 A1 | 9/2002 | Ohtsu et al. | |
| 2003/0001832 A1 * | 1/2003 | Yamazaki et al. | 345/204 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0102004 A1 | 5/2004 | Arai | |
| 2004/0127038 A1 | 7/2004 | Carcia et al. | |
| 2005/0017302 A1 | 1/2005 | Hoffman | |
| 2005/0133849 A1 * | 6/2005 | Jeon et al. | 257/314 |
| 2005/0199959 A1 | 9/2005 | Chiang et al. | |
| 2006/0035452 A1 | 2/2006 | Carcia et al. | |
| 2006/0038174 A1 * | 2/2006 | Maekawa | H01L 27/12 257/57 |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0120471 A1 * | 5/2007 | Yamazaki et al. | 313/506 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0238237 A1 * | 10/2007 | Lee | H01L 21/28282 438/197 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0315074 A1 * | 12/2009 | Wang | H01L 29/0649 257/190 |
| 2010/0051949 A1 | 3/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0109708 A1 * | 5/2010 | Koyama et al. | 326/96 |
| 2010/0140678 A1 * | 6/2010 | Shim | 257/314 |
| 2010/0148171 A1 | 6/2010 | Hayashi et al. | |
| 2011/0101351 A1 | 5/2011 | Yamazaki | |

FOREIGN PATENT DOCUMENTS

| | | |
|---|---|---|
| EP | 1737044 A | 12/2006 |
| EP | 2159845 A | 3/2010 |
| EP | 2226847 A | 9/2010 |
| JP | 60-198861 A | 10/1985 |
| JP | 63-054763 A | 3/1988 |
| JP | 63-079347 A | 4/1988 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | | |
|---|---|---|---|
| JP | 63-215519 A | 9/1988 | |
| JP | 63-239117 A | 10/1988 | |
| JP | 63-265818 A | 11/1988 | |
| JP | 64-015933 A | 1/1989 | |
| JP | 04-218920 A | 8/1992 | |
| JP | 05-234995 A | 9/1993 | |
| JP | 05-251705 A | 9/1993 | |
| JP | 06-196657 A | 7/1994 | |
| JP | 06-216258 A | 8/1994 | |
| JP | 06-252364 A | 9/1994 | |
| JP | 06-310507 * | 11/1994 | ......... H01L 21/3205 |
| JP | 06-310507 A | 11/1994 | |
| JP | 08-023041 A | 1/1996 | |
| JP | 08-264794 A | 10/1996 | |
| JP | 08-340003 A | 12/1996 | |
| JP | 09-283623 A | 10/1997 | |
| JP | 10-209389 A | 8/1998 | |
| JP | 10-242267 A | 9/1998 | |
| JP | 11-505377 | 5/1999 | |
| JP | 2000-044236 A | 2/2000 | |
| JP | 2000-150900 A | 5/2000 | |
| JP | 2001-291766 A | 10/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2005-101552 A | 4/2005 | |
| JP | 2007-160435 A | 6/2007 | |
| JP | 2008-042067 A | 2/2008 | |
| JP | 2009-054879 | 3/2009 | |
| JP | 2009-130209 A | 6/2009 | |
| JP | 2009-158528 A | 7/2009 | |
| JP | 2009-246362 A | 10/2009 | |
| JP | 2010-045263 A | 2/2010 | |
| JP | 2010-062546 A | 3/2010 | |
| JP | 2010-080952 A | 4/2010 | |
| KR | 10-0219519 A | 9/1999 | |
| TW | 200529375 | 9/2005 | |
| TW | 201001507 | 1/2010 | |
| WO | WO-03/071606 | 8/2003 | |
| WO | WO-2004/114391 | 12/2004 | |
| WO | WO-2008/136505 | 11/2008 | |

OTHER PUBLICATIONS

International Search Report (Application No. PCT/JP2011/064331), dated Aug. 23, 2011.
Written Opinion (Application No. PCT/JP2011/064331), dated Aug. 23, 2011.
Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.
Kim.W et al., "An Experimental High-Density DRAM Cell with a Built-in Gain Stage,", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.
Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by The Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

(56) References Cited

OTHER PUBLICATIONS

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AI and SN-Doped Zinc Indium Oxide Thin Film Transistors for AMOLED Backplane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5Δ) Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

(56) References Cited

OTHER PUBLICATIONS

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Taiwanese Office Action (Application No. 100122431) dated Mar. 6, 2015.

\* cited by examiner

WIRING BOARD, SEMICONDUCTOR DEVICE, AND MANUFACTURING METHODS THEREOF

TECHNICAL FIELD

The present invention relates to a wiring board, a semiconductor device, and manufacturing methods thereof.

In this specification, a semiconductor device generally means a device which can function by utilizing semiconductor characteristics, and an electro-optic device, a semiconductor circuit, and an electronic device are all semiconductor devices.

BACKGROUND ART

For connection in a multilayer wiring or between wiring layers in a semiconductor device, a method of manufacturing an embedded wiring structure using a metal material by removing an unnecessary wiring material by a CMP technique is used.

In a semiconductor device, in accordance with an increase in its integration degree, wirings and contact dimensions therebetween have been required to be miniaturized. In view of this, a favorable connection structure between wirings has been proposed (for example, see Patent Document 1) in order to prevent defective conduction between wirings that are miniaturized. In Patent Document 1, unevenness caused in a formation region of a wiring is planarized by gas ion irradiation, so that coverage by the wiring is improved.

REFERENCE

Patent Document

[Patent Document 1] Japanese Published Patent Application No. 2009-054879

DISCLOSURE OF INVENTION

It is an object to reduce defective conduction in a wiring board or semiconductor device whose integration degree is increased.

It is another object to manufacture a highly reliable wiring board or semiconductor device with high yield.

In a wiring board or a semiconductor device having a multilayer wiring structure, a conductive layer having a curved surface is used in connection between conductive layers which are used for the wirings. The conductive layer having a curved surface (which can also be referred to as a conductive layer whose surface is curved) is formed by etching of a conductive layer with the use of a resist mask having a curved surface.

The conductive layer having a curved surface does not have a steep step on its surface. Therefore, a cross section of the conductive layer has a conical or pyramidal shape with a rounded dome top. By partly removing an insulating layer around a conductive layer in a lower layer to expose the conductive layer, the top of the exposed conductive layer in the lower layer has a curved surface; thus, coverage of the conductive layer in the lower layer with a conductive layer in an upper layer which is stacked thereover can be favorable.

One embodiment of a structure of the invention disclosed in this specification is a wiring board including a first conductive layer, an insulating layer covering a side surface of the first conductive layer, and a second conductive layer which is provided over the insulating layer and in contact with a portion of the first conductive layer projected from the insulating layer. A surface of the portion of the first conductive layer projected from the insulating layer is curved.

One embodiment of a structure of the invention disclosed in this specification is a semiconductor device including a gate electrode layer of a first transistor, an insulating layer covering a side surface of the gate electrode layer, and a source or drain electrode layer of a second transistor which is provided over the insulating layer and in contact with a portion of the gate electrode layer projected from the insulating layer. A surface of the portion of the gate electrode layer projected from the insulating layer is curved.

One embodiment of a structure of the invention disclosed in this specification is a manufacturing method of a wiring board including the steps of forming a conductive film over an insulating surface, forming a resist mask having a curved surface over the conductive film, etching the conductive film with an etching gas using the resist mask having a curved surface to form a first conductive layer having a curved surface, forming an insulating layer over the first conductive layer, etching the insulating layer to expose a part of the first conductive layer, and forming a second conductive layer over the insulating layer and in contact with the first conductive layer.

One embodiment of a structure of the invention disclosed in this specification is a manufacturing method of a wiring board including the steps of forming a conductive film over an insulating surface, forming a resist mask having a tapered shape over the conductive film, performing heat treatment on the resist mask having a tapered shape to form a resist mask having a curved surface, etching the conductive film with an etching gas using the resist mask having a curved surface to form a first conductive layer having a curved surface, forming an insulating layer over the first conductive layer, etching the insulating layer to expose a part of the first conductive layer, and forming a second conductive layer over the insulating layer and in contact with the first conductive layer.

One embodiment of a structure of the invention disclosed in this specification is a manufacturing method of a semiconductor device including the steps of forming a conductive film, forming a resist mask having a curved surface over the conductive film, etching the conductive film with an etching gas using the resist mask having a curved surface to form a gate electrode layer having a curved surface of a first transistor, forming an insulating layer over the gate electrode layer, etching the insulating layer to expose a part of the gate electrode layer, and forming a source or drain electrode layer of a second transistor over the insulating layer and in contact with the gate electrode layer.

One embodiment of a structure of the invention disclosed in this specification is a manufacturing method of a semiconductor device including the steps of forming a conductive film, forming a resist mask having a tapered shape over the conductive film, performing heat treatment on the resist mask having a tapered shape to form a resist mask having a curved surface, etching the conductive film with an etching gas using the resist mask having a curved surface to form a gate electrode layer having a curved surface of a first transistor, forming an insulating layer over the gate electrode layer, etching the insulating layer to expose a part of the gate electrode layer, and forming a source or drain electrode layer of a second transistor over the insulating layer and in contact with the gate electrode layer.

In a stacked structure of conductive layers, a conductive layer in an upper layer is formed over a conductive layer in a lower layer with good coverage, so that electrical connection between the conductive layers can be ensured. Therefore, poor characteristics due to a defect in the shape of a film can be prevented in manufacturing, so that yield is improved, and reliability of a wiring board or a semiconductor device can be improved.

BEST MODE FOR CARRYING OUT THE INVENTION

Hereinafter, embodiments and an example of the invention disclosed in this specification will be described with reference to the accompanying drawings. Note that the invention disclosed in this specification is not limited to the following description, and it is easily understood by those skilled in the art that modes and details can be variously changed. Therefore, the invention disclosed in this specification is not construed as being limited to the following description of the embodiments and the example. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a wiring board, a semiconductor device, and manufacturing methods thereof will be described with reference to FIGS. 1A and 1B, FIGS. 2A to 2E, and FIG. 3.

Figure 1A:
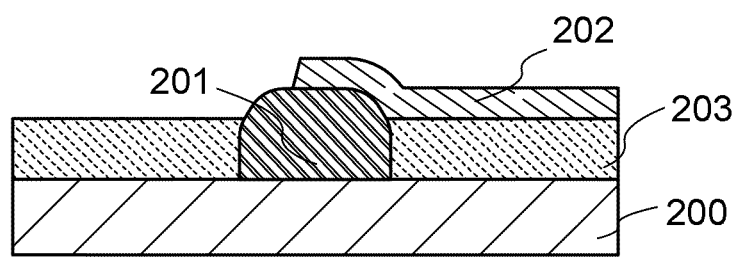
FIGS. 1A and 1B illustrate one embodiment of a wiring board.

FIG. 1A illustrates a wiring board of this embodiment, including a connection structure of stacked conductive layers. A conductive layer 201 is provided over an insulating layer 200, and an insulating layer 203 is formed around the conductive layer 201 except for an upper portion thereof. A conductive layer 202 is formed over the insulating layer 203 and in contact with part of the conductive layer 201 that is projected from the insulating layer 203, so that the conductive layer 202 is electrically connected to the conductive layer 201.

The conductive layer 201 is a conductive layer having a curved surface. By etching of a conductive film with the use of a resist mask having a curved surface, the conductive layer 201 without a steep step on its surface can be formed.

FIGS. 2A to 2E illustrate a method for manufacturing the wiring board in FIG. 1A including a connection structure of stacked conductive layers.

Figure 2A:
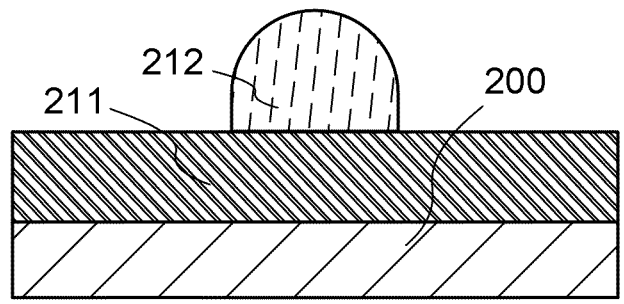
FIGS. 2A to 2E illustrate one embodiment of a wiring board.

A conductive film 211 is formed over the insulating layer 200, and a resist mask 212 is formed over the conductive film 211 (see FIG. 2A). The resist mask 212 has a curved surface and its cross-sectional shape is almost a semicircle as illustrated in FIG. 2A.

The shape of the resist mask 212 can be controlled by performing heat treatment after forming a resist mask having a tapered shape by a photolithography step. A taper angle (an angle formed between a top surface of the conductive film 211 and a side surface of the resist mask) of the resist mask may be less than 90° before the heat treatment. In this embodiment, a resist mask having a taper angle of 75° is formed, and then heat treatment is performed at 180° C. for two hours.

Figure 2B:
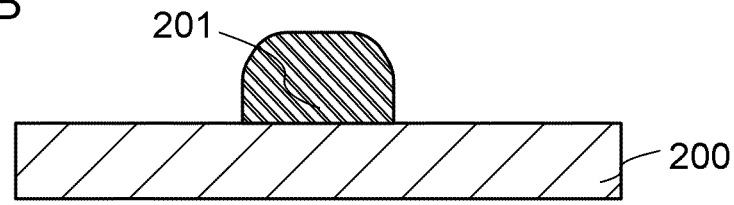

The conductive film 211 is etched using the resist mask 212 having a curved surface, so that the conductive layer 201 having a curved surface is formed (see FIG. 2B). The etching is dry etching. As an etching gas, a gas containing chlorine (a chlorine-based gas such as chlorine ($Cl_2$), boron trichloride ($BCl_3$), silicon tetrachloride ($SiCl_4$), or carbon tetrachloride ($CCl_4$)) or a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)) can be used. Alternatively, a gas obtained by adding oxygen or a rare gas (such as Ar) to the above gas may be used as the etching gas.

As the integration degree of a semiconductor device is increased, the line width of a conductive layer is further miniaturized. Miniaturized line width makes it difficult for the conductive layer to have a tapered shape, so that the conductive layer is likely to have a perpendicular side surface. In a conductive layer having a perpendicular side surface, an upper end portion projected from an insulating layer has a steep angle, which leads to poor coverage with a conductive layer in an upper layer to be formed thereover.

As disclosed in this specification, by formation of a conductive layer with the use of a resist whose shape is controlled to have a curved surface, the conductive layer can have a curved surface even with a line width as small as 1 µm or less. Therefore, defective conduction due to poor coverage between conductive layers is suppressed, and a highly reliable wiring board or semiconductor device can be manufactured with high yield.

Figure 2C:
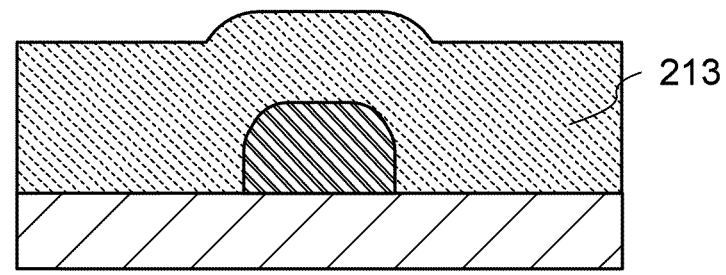

An insulating layer 213 is formed so as to cover the conductive layer 201 (see FIG. 2C).

Figure 2D:
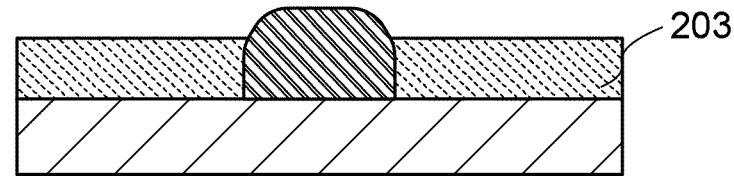

Next, the insulating layer 213 is etched, so that the insulating layer 203 which is planarized is formed and, at the same time, the upper portion of the conductive layer 201 is exposed to be projected (see FIG. 2D).

Although there is no particular limitation on a method for partly removing (etching) the insulating layer 213 to planarize the insulating layer 213 and expose the conductive layer 201, a chemical mechanical polishing (CMP) method can be favorably used.

For example, in the case of using a silicon oxide film as the insulating layer 213, an example of process conditions of the CMP method is as follows: slurry and a polishing cloth are used, the pressure is 0.01 MPa, the spindle rotation speed (the number of rotations) is 20 rpm, and the table rotation speed (the number of rotations) is 20 rpm.

Figure 2E:
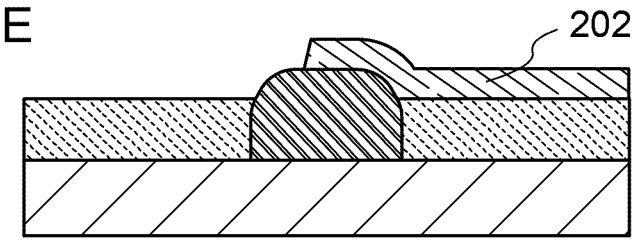

The conductive layer 202 is formed over the insulating layer 203 and in contact with the projected part of the conductive layer 201, and the conductive layer 202 is electrically connected to the conductive layer 201 (see FIG. 2E).

The conductive layer 201 in this embodiment is a conductive layer having a curved surface without a steep step, as described above. Therefore, a cross section of the conductive layer 201 has a conical or pyramidal shape with a rounded dome top. Accordingly, the top of the conductive layer 201, which is exposed by removing the insulating layer 213 therearound in the CMP treatment, has a curved surface, so that the coverage of the conductive layer 201 with the conductive layer 202 stacked thereover can be favorable.

The conductive layer 202 is formed over the conductive layer 201 with good coverage, whereby electric connection between the conductive layer 201 and the conductive layer 202 can be ensured. Therefore, poor characteristics due to a defect in the shape of a film can be suppressed in manufacturing, so that yield is improved, and reliability of a semiconductor device can be improved.

Figure 1B:
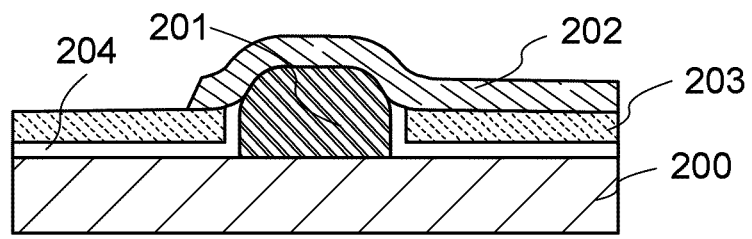

FIG. 1B is an example in which insulating layers are stacked, where an insulating layer 204 and the insulating layer 203 are stacked. When different insulating layers are stacked in such a manner, the insulating layers may be etched excessively (such etching is so-called over etching) as illustrated in FIG. 1B, owing particularly to a difference in etching conditions. Therefore, it is advantageous that the projected part of the conductive layer 201 has a curved surface without a steep step.

In FIG. 1B, the conductive layer 202 covers the entire region of the conductive layer 201 projected from the insulating layer 203. In the structure where the conductive layer 202 covers the conductive layer 201, even when the conductive layer 201 and the conductive layer 202 are formed using the same material or materials having close etching rates, the conductive layer 201 can be prevented from being etched at an etching step of the conductive layer 202.

Figure 3:
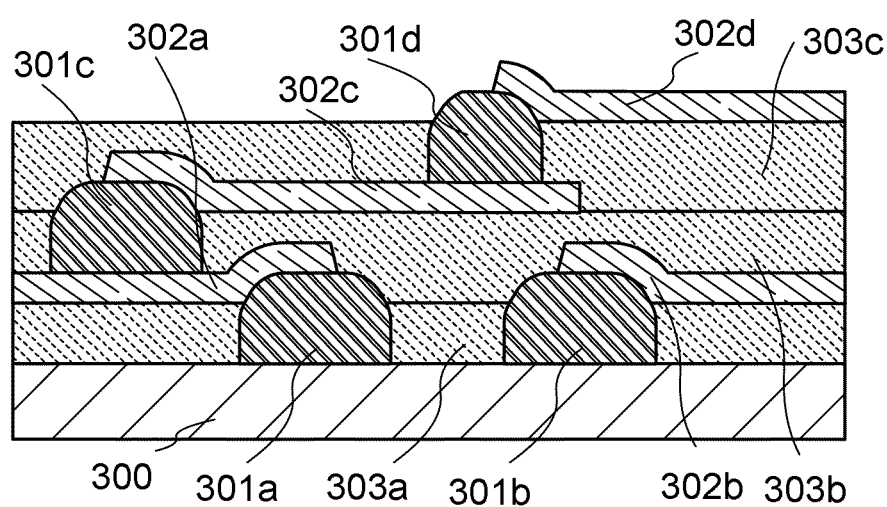
FIG. 3 illustrates one embodiment of a semiconductor device.

A semiconductor device can be provided using the wiring board disclosed in this specification. FIG. 3 illustrates an example of a semiconductor device which includes a wiring board illustrated in FIGS. 1A and 1B and FIGS. 2A to 2E, including a multilayer wiring structure in which a conductive layer having a curved surface is used.

In FIG. 3, an insulating layer 303a, and conductive layers 301a and 301b whose upper portions are projected from the insulating layer 303a are provided over an insulating layer 300, and a conductive layer 302a and a conductive layer 302b are formed in contact with the conductive layer 301a and the conductive layer 301b, respectively.

An insulating layer 303b is formed over the conductive layers 302a and 302b, a conductive layer 301c which is in contact with the conductive layer 302a and whose upper portion is projected from the insulating layer 303b is formed, and a conductive layer 302c is formed in contact with the conductive layer 301c.

An insulating layer 303c and a conductive layer 301d which is in contact with the conductive layer 302c and whose upper portion is projected from the insulating layer 303c are formed over the conductive layer 302c, and a conductive layer 302d is formed in contact with the conductive layer 301d.

Since conduction between the stacked conductive layers is favorable, electrical connection can be ensured even in a multilayer structure of conductive layers as illustrated in FIG. 3.

The conductive layer 201, the conductive layer 202, the conductive layers 301a, 301b, 301c, and 301d, and the conductive layers 302a, 302b, 302c, and 302d can be formed with a single-layer structure or a stacked-layer structure using a metal material such as molybdenum, titanium, chromium, tantalum, tungsten, aluminum, copper, neodymium, or scandium or an alloy material containing any of these materials as its main component. As a method for forming the conductive layer 201, the conductive layer 202, the conductive layers 301a, 301b, 301c, and 301d, and the conductive layers 302a, 302b, 302c, and 302d, a sputtering method, an evaporation method, a CVD method, or the like can be used.

As the insulating layer 203, the insulating layer 204, and the insulating layers 303a, 303b, and 303c, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can typically be used. The insulating layer 203, the insulating layer 204, and the insulating layers 303a, 303b, and 303c can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be used to form the insulating layer 203, the insulating layer 204, and the insulating layers 303a, 303b, and 303c.

The insulating layer 203, the insulating layer 204, and the insulating layers 303a, 303b, and 303c may be formed by stacking a plurality of insulating films formed using any of these materials.

The insulating layer 200 and the insulating layer 300 can be formed using a material and a method similar to those of the insulating layer 203, the insulating layer 204, and the insulating layers 303a, 303b, and 303c.

A substrate may alternatively be used as the insulating layer 200. As a substrate which can be used as the insulating layer 200, insulating substrates including: a variety of glass substrates that are used in the electronics industry, such as aluminosilicate glass substrates, aluminoborosilicate glass substrates, and barium borosilicate glass substrates; quartz substrates; ceramic substrates; sapphire substrates; and plastic substrates can be given. Alternatively, a single crystal semiconductor substrate (such as a single crystal silicon substrate) or a polycrystalline semiconductor substrate (such as a polycrystalline silicon substrate) can be used.

In the semiconductor device having a multilayer wiring structure described in this embodiment, a conductive layer having a curved surface is used in the connection between conductive layers, whereby a highly reliable semiconductor device with sufficiently high integration degree can be realized.

Embodiment 2

A semiconductor device can be provided using the wiring board described in Embodiment 1, including a connection structure of conductive layers. In this embodiment, a memory medium (memory element) will be described as an example of a semiconductor device in which the wiring board described in Embodiment 1, including a connection structure of conductive layers is used.

The connection structure of conductive layers described in Embodiment 1 can be favorably used in an integration circuit in which a plurality of transistors is stacked. In this embodiment, a semiconductor device including a transistor 140 that is a first transistor, which is formed over a single crystal semiconductor substrate, and a transistor 162 that is a second transistor, which is formed using a semiconductor film above the transistor 140 with an insulating layer interposed therebetween, is manufactured.

In a semiconductor device to which the connection structure of conductive layers disclosed in this specification can be applied, semiconductor materials and structures may be either the same or different among transistors to be stacked. This embodiment describes an example in which a transistor with a suitable material and structure is used in each circuit of a memory medium (memory element).

Figure 4A:
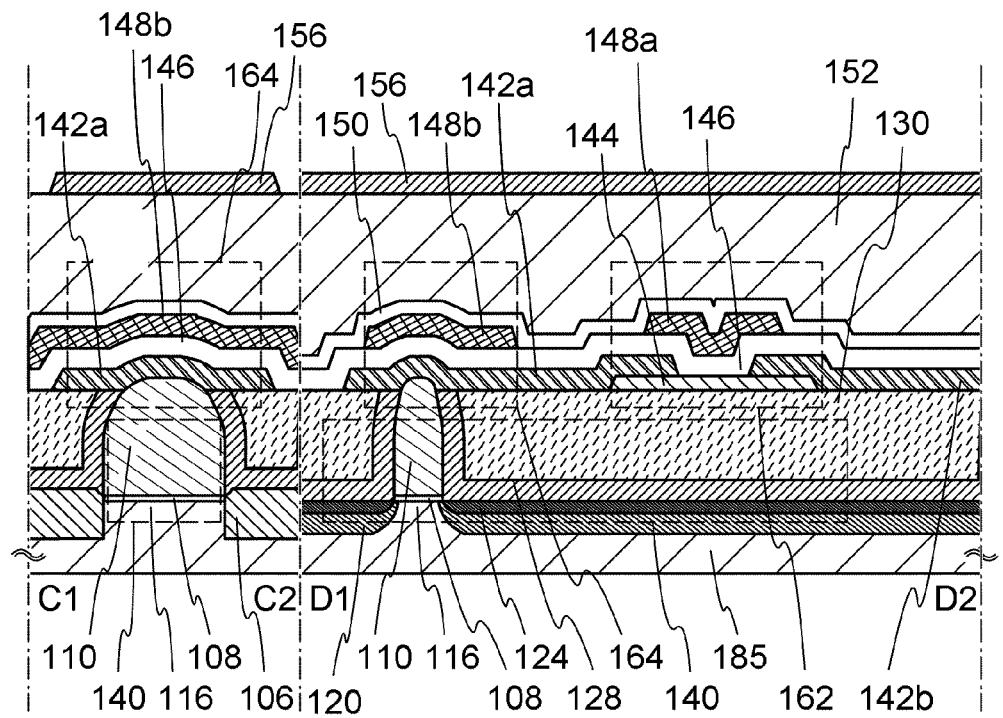
FIGS. 4A to 4C illustrate one embodiment of a semiconductor device.
Figure 4B:
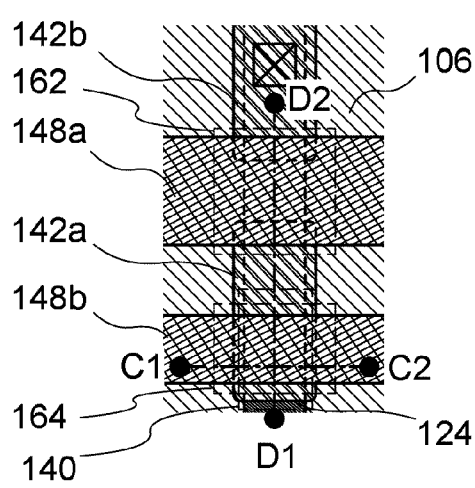
Figure 4C:
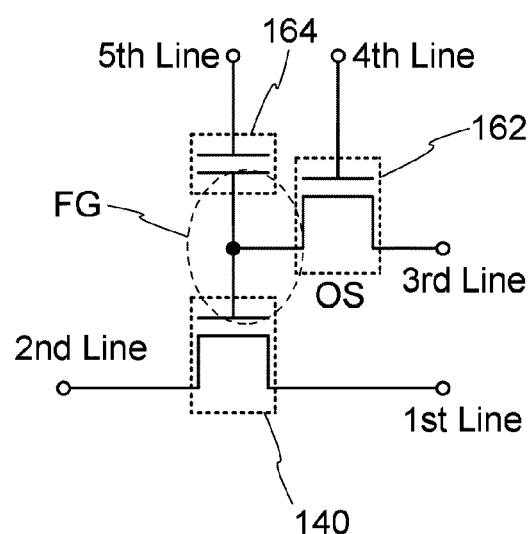

FIGS. 4A to 4C illustrate an example of a structure of a semiconductor device. FIG. 4A illustrates a cross section of the semiconductor device, and FIG. 4B illustrates a plan view of the semiconductor device. Here, FIG. 4A illustrates a cross section taken along line C1-C2 and line D1-D2 in FIG. 4B. In addition, FIG. 4C illustrates an example of a diagram of a circuit using the semiconductor device as a memory element. The semiconductor device illustrated in FIGS. 4A and 4B includes a transistor 140 including a first semiconductor material in a lower portion, and a transistor 162 including a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at high speed easily. On the other hand, a transistor including an oxide semiconductor can hold charge for a long time owing to its characteristics.

A manufacturing method of the semiconductor device in FIGS. 4A to 4C will be described with reference to FIGS. 5A to 5C.

The transistor 140 includes a channel formation region 116 provided in a substrate 185 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

The gate electrode 110 in this embodiment is a conductive layer having a curved surface as described in Embodiment 1. By etching of a conductive layer with the use of a resist mask having a curved surface, the gate electrode 110 without a steep step on its surface can be formed.

As the substrate 185 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An element isolation insulating layer 106 is provided over the substrate 185 so as to surround the transistor 140. Note that it is preferable that the transistor 140 do not have a sidewall insulating layer as illustrated in FIGS. 4A to 4C to realize high integration. On the other hand, when importance is put on the characteristics of the transistor 140, sidewall insulating layers may be provided on side surfaces of the gate electrode 110, and the impurity regions 120 may include a region with a different impurity concentration.

The transistor 140 including a single crystal semiconductor substrate can operate at high speed. Thus, when the transistor is used as a reading transistor, data can be read at a high speed.

Figure 5A:
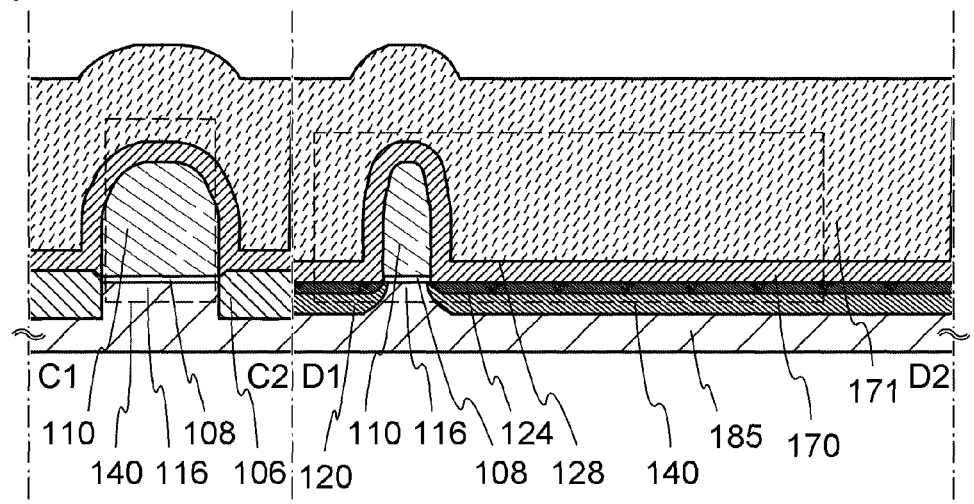
FIGS. 5A to 5C illustrate one embodiment of a method for manufacturing a semiconductor device.

After the transistor 140 is formed, an insulating layer 170 and an insulating layer 171 are formed so as to cover the transistor 140 (see FIG. 5A).

As the insulating layer 170 and the insulating layer 171, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can typically be used. The insulating layer 170 and the insulating layer 171 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be used to form the insulating layer 170 and the insulating layer 171.

The insulating layer 170 and the insulating layer 171 may be formed by stacking a plurality of insulating films formed using any of these materials.

In this embodiment, as the insulating layer 170, a silicon oxynitride film with a thickness of 50 nm is formed by a sputtering method, and as the insulating layer 171, a silicon oxide film with a thickness of 550 nm is formed by a sputtering method.

Figure 5B:
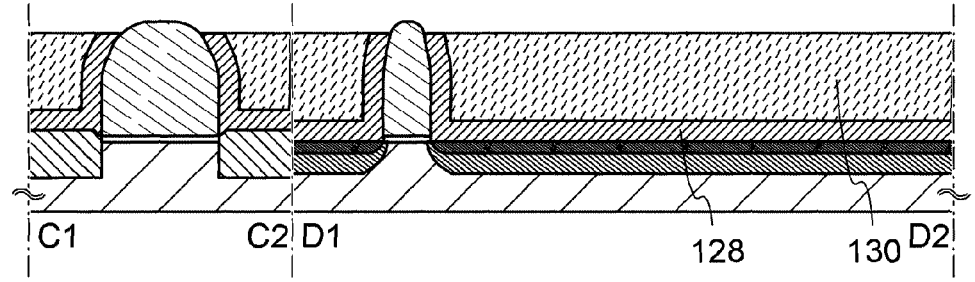
Figure 5C:
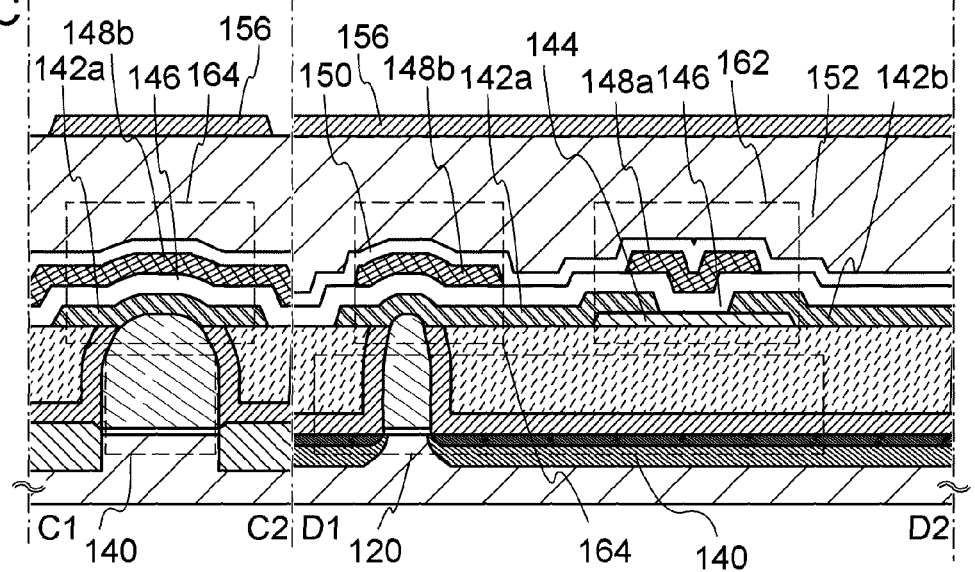

Next, as treatment before the formation of the transistor 162 and a capacitor 164, CMP treatment is performed on the insulating layer 170 and the insulating layer 171, whereby an insulating layer 128 and an insulating layer 130 which are planarized are formed and, at the same time, an upper surface of the gate electrode 110 is exposed (see FIG. 5B).

A semiconductor film is formed over the insulating layer 130 which is sufficiently planarized by the CMP treatment, and then the semiconductor film is selectively etched, so that a semiconductor layer 144 is formed. In this embodiment, an oxide semiconductor film is formed using an In—Ga—Zn—O-based oxide target by a sputtering method as the semiconductor layer 144.

After that, heat treatment (first heat treatment) is preferably performed on the oxide semiconductor film. By the first heat treatment, excessive hydrogen (including water and a hydroxyl group) in the oxide semiconductor film is removed and the structure of the oxide semiconductor film is ordered, so that defect levels in the energy gap can be reduced. The temperature of the first heat treatment is, for example, higher than or equal to 300° C. and lower than 550° C., preferably higher than or equal to 400° C. and lower than or equal to 500° C.

The heat treatment can be performed in such a way that, for example, an object to be heated is introduced into an electric furnace in which a resistance heating element or the like is used and heated at 450° C. for one hour under a nitrogen atmosphere. The oxide semiconductor film is not exposed to the air during the heat treatment so that entry of water or hydrogen can be prevented. Impurities are reduced by the first heat treatment, so that an i-type (intrinsic) or substantially i-type oxide semiconductor film is obtained. Accordingly, a transistor having significantly excellent characteristics can be realized.

Next, a conductive layer is formed over the gate electrode 110, the insulating layer 128, the insulating layer 130, and the like, and etched selectively, so that a source or drain electrode 142a and a source or drain electrode 142b are formed.

The gate electrode 110 in this embodiment is a conductive layer having a curved surface without a steep step, as described in Embodiment 1. Therefore, a cross section of the gate electrode 110 has a conical or pyramidal shape with a rounded dome top, as illustrated in FIG. 4A. Accordingly, the top of the gate electrode 110, which is exposed by removing the insulating layers 128 and 130 therearound in the CMP treatment, has a curved surface, so that the coverage of the gate electrode 110 with the source or drain electrode 142a stacked thereover can be favorable.

The source or drain electrode 142a is formed over the gate electrode 110 with good coverage, whereby electric connection between the source or drain electrode 142a and the gate electrode 110 can be ensured. Therefore, poor characteristics due to a defect in the shape of a film can be suppressed in manufacturing, so that yield is improved, and reliability of the semiconductor device can be improved.

The conductive layer can be formed by a PVD method such as a sputtering method, or a CVD method such as a plasma CVD method. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

The channel length (L) of the upper transistor 162 is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, a gate insulating layer 146 is formed in contact with the semiconductor layer 144. The gate insulating layer 146 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, and a gallium oxide layer by a plasma CVD method, a sputtering method, or the like.

Next, over the gate insulating layer 146, a gate electrode 148a is formed in a region overlapping with the semiconductor layer 144 and an electrode 148b is formed in a region overlapping with the source or drain electrode 142a.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour under a nitrogen atmosphere. By performing the second heat treatment, variation in electrical characteristics of the transistor can be reduced. Further, as a film containing oxygen, the gate insulating layer 146 can supply oxygen to the semiconductor layer 144 to fill oxygen vacancies in the semiconductor layer 144, so that an i-type (intrinsic) or substantially i-type oxide semiconductor layer can be formed.

Note that the timing of the second heat treatment is not particularly limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is performed, so that the semiconductor layer 144 can be highly purified so as to contain impurities which are not main components as little as possible.

The gate electrode 148a and the electrode 148b can be formed in such a manner that a conductive layer is formed over the gate insulating layer 146 and then etched selectively.

Then, an insulating layer 150 and an insulating layer 152 are formed over the gate insulating layer 146, the gate electrode 148a, and the electrode 148b. The insulating layer 150 and the insulating layer 152 can be formed by a sputtering method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the gate insulating layer 146, the insulating layer 150, and the insulating layer 152. The opening is formed by selective etching with the use of a mask or the like.

After that, a wiring 156 is formed in the opening to be in contact with the source or drain electrode 142b. Note that a connection point of the source or drain electrode 142b and the wiring 156 is not illustrated in FIGS. 5A to 5C.

The wiring 156 is formed in such a manner that a conductive layer is formed by a PVD method such as a sputtering method or a CVD method such as a plasma CVD method and then the conductive layer is etched. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are the similar to those of the source or drain electrode 142a and the like.

Through the above process, the transistor 162 including the highly purified semiconductor layer 144 and the capacitor 164 are completed. The capacitor 164 includes the source or drain electrode 142a, the semiconductor layer 144, the gate insulating layer 146, and the electrode 148b.

Note that in the capacitor 164 illustrated in FIGS. 4A to 4C, insulation between the source or drain electrode 142a and the electrode 148b can be sufficiently secured by stacking the semiconductor layer 144 and the gate insulating layer 146. It is needless to say that the capacitor 164 without the semiconductor layer 144 may be employed in order to secure sufficient capacitance. Alternatively, an insulating layer may be included in the capacitor 164. Further alternatively, the capacitor 164 may be omitted in the case where a capacitor is not needed.

FIG. 4C illustrates an example of a diagram of a circuit using the semiconductor device as a memory element. In FIG. 4C, one of a source electrode and drain electrode of the transistor 162, one electrode of the capacitor 164, and a gate electrode of the transistor 140 are electrically connected to one another. A first wiring (1st line, also referred to as a source line) is electrically connected to a source electrode of the transistor 140. A second wiring (2nd line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th line, also referred to as a word line) is electrically connected to the other electrode of the capacitor 164.

The transistor 162 including an oxide semiconductor has extremely low off-state current; therefore, when the transistor 162 is in an off state, a potential of a node (hereinafter, a node FG) where the one of the source electrode and drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

When data is stored in the memory cell (in writing of data), first, the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 162 is turned off, whereby the transistor 162 is turned off. This makes the node FG floating and the predetermined amount of charge is held in the node FG. The predetermined amount of charge is thus accumulated and held in the node FG, whereby the memory cell can store data.

Since the off-state current of the transistor 162 is extremely small, the charge applied to the node FG is held for a long period. This can remove the need of refresh operation or drastically reduce the frequency of the refresh operation, which leads to a sufficient reduction in power consumption. Moreover, stored data can be stored for a long time even when power is not supplied.

When stored data is read out (in reading of data), while a predetermined potential (a fixed potential) is applied to the first wiring, an appropriate potential (a read-out potential) is applied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where a high-level charge is held in the node FG is lower than an apparent threshold value $V_{th\_L}$ of the transistor 140 in the case where a low-level charge is held in the node FG. Here, an apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 140 is turned on. In the case where a low level charge is given in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 162 is turned on, whereby the transistor 162 is turned on. Thus, the potential of the third wiring (a potential of new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in the first writing is held in the node FG, the same operation (a second writing) as in the first writing is performed, whereby the stored data can be overwritten.

The off-state current of the transistor 162 described in this embodiment can be sufficiently reduced by using a highly purified and intrinsic oxide semiconductor layer as the semiconductor layer 144. With the use of such a transistor, a semiconductor device in which stored data can be stored for an extremely long time can be obtained.

In the semiconductor device described in this embodiment, the transistor 140 and the transistor 162 overlap with each other, and the connection structure therebetween includes a conductive layer having a curved surface; therefore, a highly reliable semiconductor device whose integration degree is sufficiently improved can be realized.

The structures, methods, and the like described in this embodiment can be combined as appropriate with any of the structures, methods, and the like and described in the other embodiments.

Embodiment 3

Another example of a semiconductor substrate which can be used in Embodiment 2 will be described with reference to FIG. 6 and FIGS. 7A to 7D. In this embodiment, a semiconductor substrate over which a single crystal semiconductor layer is provided with an insulating layer interposed therebetween is used.

Figure 6:
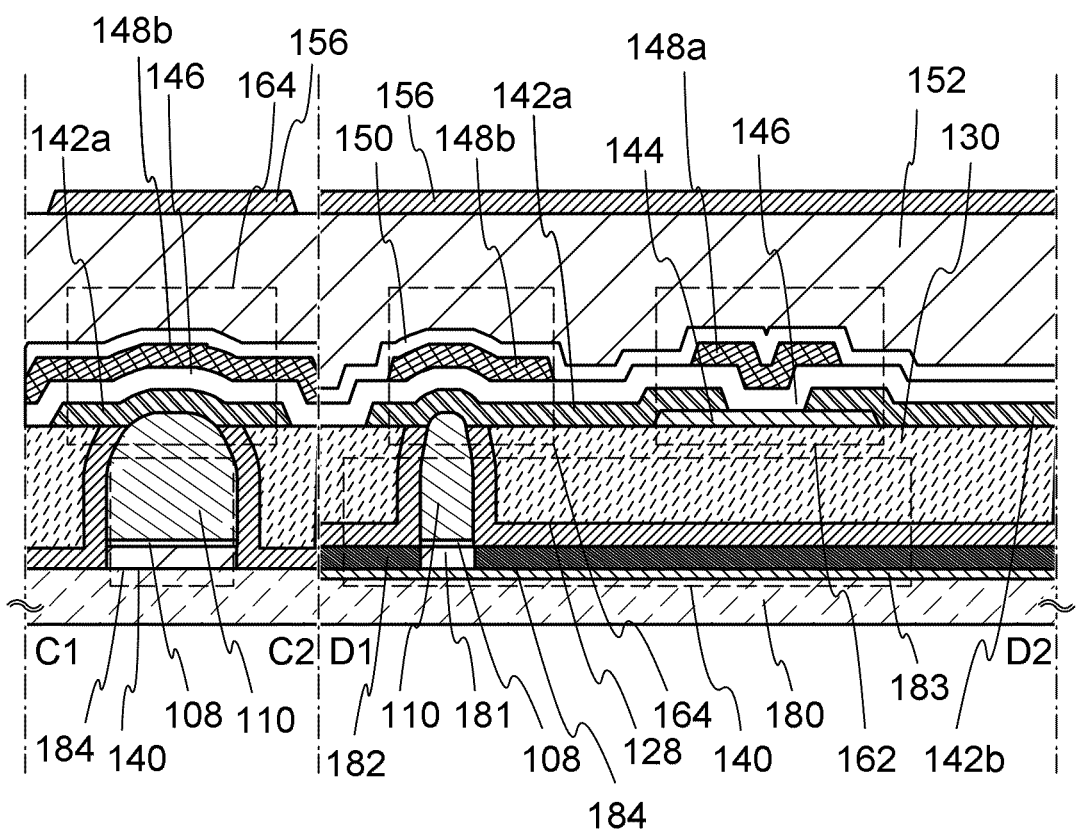
FIG. 6 illustrates one embodiment of a semiconductor device.

In the semiconductor device illustrated in FIG. 6, the transistor 140 is provided over a base substrate 180 with an insulating layer 183 interposed therebetween. The transistor 140 includes an island-shaped semiconductor layer 184, and the semiconductor layer 184 includes a channel formation region 181 overlapping with the gate electrode 110 and impurity regions 182 serving as a source region and a drain region between which the channel formation region 181 is positioned. Since the semiconductor layer 184 is independently formed in an island shape, the element isolation insulating layer 106 which is provided in the semiconductor device of Embodiment 2, illustrated in FIGS. 5A to 5C need not be formed. In FIG. 6, the gate insulating layer 108 is selectively provided below the gate electrode 110; however, the gate insulating layer 108 may be formed so as to cover the entire surface of the base substrate 180.

FIGS. 7A to 7D illustrate a method for manufacturing the semiconductor device of this embodiment.

First, a single crystal semiconductor substrate 190 is prepared.

As the single crystal semiconductor substrate 190, a single crystal semiconductor substrate formed using an element belonging to Group 14 of the periodic table, such as a single crystal silicon substrate, a single crystal germanium substrate, or a single crystal silicon germanium substrate, or a compound semiconductor substrate of gallium arsenide, indium phosphide, or the like can be used. Typical examples of commercially available single crystal silicon substrates include circular substrates which are 5 inches (approximately 125 mm) in diameter, 6 inches (approximately 150 mm) in diameter, 8 inches (approximately 200 mm) in diameter, 12 inches (approximately 300 mm) in diameter, and 16 inches (approximately 400 mm) in diameter, and a single crystal silicon substrate having any of these sizes can be used. Note that the shape of the single crystal semiconductor substrate 190 is not limited to a circular shape, and a single crystal semiconductor substrate processed into a rectangular shape or the like can also be used. In this embodiment, a case will be described in which a single crystal silicon substrate is used as the single crystalline semiconductor substrate 190.

Figure 7A:
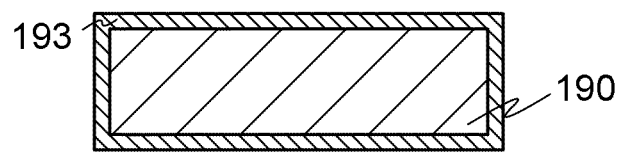
FIGS. 7A to 7D illustrate one embodiment of a method for manufacturing a semiconductor device.

Next, an insulating layer 193 is formed on a surface of the single crystal semiconductor substrate 190 (see FIG. 7A).

Before the formation of the insulating layer 193, diluted hydrofluoric acid may be preferably used to clean the single crystal semiconductor substrate. In this case, diluted hydrofluoric acid and ozone water may be discharged alternately for cleaning. If necessary, ultrasonic cleaning or twin-fluid jet cleaning is preferably combined. As the ultrasonic cleaning, megahertz ultrasonic cleaning (megasonic cleaning) is preferable. This cleaning allows foreign substances and organic contamination at the surface of the single crystal semiconductor substrate to be reduced to form the insulating layer 193 uniformly.

As a material for forming the insulating layer 193, a silicon oxide film can be given.

As a method for forming the insulating layer 193, a thermal oxidation method, a CVD method, and a sputtering method can be given.

For example, in the case of forming the insulating layer 193 (in this embodiment, a silicon oxide film) by using a thermal oxidation method, thermal oxidation is preferably carried out in an oxidizing atmosphere containing oxygen ($O_2$) as a main component gas, and containing halogen. For example, the thermal oxidation treatment is performed on the single crystal semiconductor substrate 190 in an oxidizing atmosphere containing chlorine (Cl), whereby the insulating layer 193 is formed through chlorine oxidation. In this case, the insulating layer 193 is an insulating layer containing chlorine atoms. The chlorine atoms contained in the insulating layer 193 cause distortions. As a result, the moisture absorption rate of the insulating layer 193 is improved to increase the diffusion rate of moisture. That is, when moisture is present on a surface of the insulating layer 193, the moisture present on the surface can be rapidly absorbed and diffused into the insulating layer 193.

As an example of the thermal oxidation treatment, thermal oxidation can be performed in an oxidizing atmosphere which contains hydrogen chloride (HCl) at a proportion of 0.5 volume % to 10 volume % (typically, 3 volume %) with respect to oxygen at a temperature of 900° C. to 1150° C. (typically, 1000° C.). The treatment time may be 0.1 hours to 6 hours, preferably 0.5 hours to 1 hour. The thickness of an oxide film formed by the thermal oxidation treatment may be 10 nm to 1000 nm (preferably, 50 nm to 300 nm), for example, 100 nm.

Figure 7B:
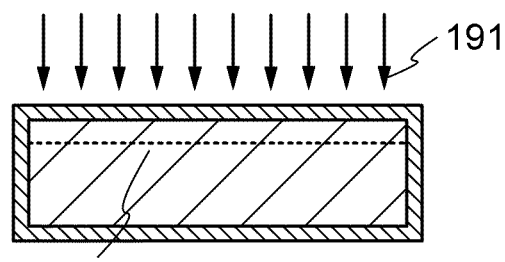

Next, the single crystal semiconductor substrate 190 is irradiated with hydrogen ions 191, so that an embrittled region 192 is formed (see FIG. 7B).

The surface of the insulating layer 193 may be cleaned with the use of pure water before hydrogen ion irradiation. In this case, ozone water may be used instead of pure water. Alternatively, ultrasonic cleaning or twin-fluid jet cleaning may be combined. As the ultrasonic cleaning, megahertz ultrasonic cleaning (megasonic cleaning) is preferable. However, cleaning with diluted hydrofluoric acid makes the surface of the insulating layer 193 hydrophobic, which may cause defective bonding to the base substrate. Therefore, it is preferable not to use the cleaning with diluted hydrofluoric acid. This cleaning can reduce foreign substances and organic contamination at the surface of the insulating layer 193.

The step of hydrogen ion irradiation can be carried out by an ion doping method using an ion doping apparatus or by an ion implantation method using an ion implantation apparatus.

In this embodiment, a case will be given in which the single crystal semiconductor substrate 190 is irradiated with ions which are not subjected to mass separation, with the use of an ion doping apparatus. A typical example of the ion doping apparatus is a non-mass separation type apparatus for irradiating an object to be processed placed in a chamber with all kinds of ion species generated by plasma excitation of a process gas. In this specification, a method in which an object is irradiated, with the use of an ion doping apparatus, with ions generated from a source gas (material gas), which are not subjected to mass separation, is referred to as an "ion doping method".

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting the source gas to generate plasma, and the like. As the electrode for generating plasma, a filament electrode, a capacitively-coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated in the ion source are accelerated. Note that components of the ion doping apparatus are not limited to the components described above and a mechanism according to need is provided.

Note that an ion implantation apparatus which can be used as an ion irradiation apparatus is an apparatus for subjecting ion species in plasma to mass separation and irradiating an object to be processed with an ion species having a specific mass (a mass-separation type apparatus), which is significantly different from an ion doping apparatus in this respect.

Next, a method for transferring a single crystal semiconductor layer of a single crystal semiconductor substrate to a base substrate will be described.

First, the base substrate 180 is prepared. It is preferable to clean a surface of the base substrate 180 in advance before using the base substrate 180. Specifically, ultrasonic cleaning is performed on the surface of the base substrate 180 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. By such cleaning treatment, the surface of the base substrate 180 can be planarized and residual abrasive particles can be removed.

As the base substrate 180, an insulating substrate is preferably used. As specific examples of an insulating substrate, a variety of glass substrates that are used in the electronics industry, such as aluminosilicate glass substrates, aluminoborosilicate glass substrates, and barium borosilicate glass substrates; quartz substrates; ceramic substrates; sapphire substrates; and plastic substrates can be given. In addition, while a single crystal semiconductor substrate (for example, a single crystal silicon substrate) or a polycrystalline semiconductor substrate (for example, a polycrystalline silicon substrate) can also be used as the base substrate 180, an insulating substrate which can have a larger size and is inexpensive is preferably used in consideration of mass productivity and cost. In this embodiment, a description is given of the case where a glass substrate which is one of insulating substrates is used as the base substrate 180.

Figure 7C:
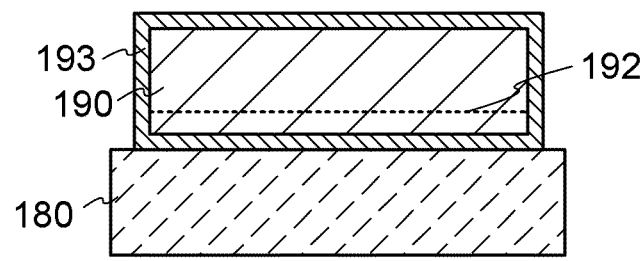

Next, the single crystal semiconductor substrate 190 and the base substrate 180 are bonded to each other with the insulating layer 193 therebetween (see FIG. 7C).

Figure 7D:
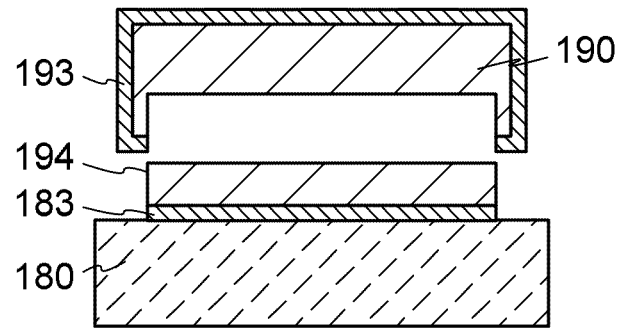

Next, heat treatment is performed to separate the single crystal semiconductor substrate 190 at the embrittled region 192, and thereby a single crystal semiconductor layer 194 is provided over the base substrate 180 (see FIG. 7D). The heat treatment forms minute voids in the embrittled region 192, separates an element added by the ion irradiation out into the minute voids, and increases the internal pressure of the minute voids. The increase in pressure causes a change in the volume of the minute voids in the embrittled region 192, and causes a crack in the embrittled region 192. Thus, the single crystal semiconductor substrate 190 is separated along the embrittled region 192. As a result, the single crystal semiconductor layer 194 which is separated from the single crystal semiconductor substrate 190 is formed over the base substrate 180 with the insulating layer 193 therebetween. The thickness of the single crystal semiconductor layer 194 which is formed after the separation may be, for example, greater than or equal to 10 nm and less than or equal to 500 nm, preferably greater than or equal to 50 nm and less than or equal to 200 nm. Note that as a heating unit for performing the heat treatment, a heating furnace such as a resistance heating furnace, a rapid thermal annealing (RTA) apparatus, a microwave heating apparatus, or the like can be used. For example, in the case where an RTA apparatus is used, the heat treatment may be performed at a heating temperature of higher than or equal to 550° C. and lower than or equal to 730° C. for a treatment time of greater than or equal to 0.5 minutes and less than or equal to 60 minutes.

The single crystal semiconductor layer 194 provided over the base substrate 180 with the insulating layer 183 interposed therebetween is etched into an island shape, so that the semiconductor layer 184 is obtained. A photolithography step may be used for the etching of the single crystal semiconductor layer 194.

The impurity regions 182 are formed in the semiconductor layer 184; thus, the transistor 140 can be manufactured. The impurity regions 182 may be formed by adding an impurity element imparting a conductivity type (an impurity element imparting n-type conductivity, such as phosphorus (P), or an impurity element imparting p-type conductivity, such as boron (B)) to the semiconductor layer 184.

The subsequent steps may be performed in a manner similar to that of Embodiment 2, so that the semiconductor device of this embodiment illustrated in FIG. 6 can be manufactured.

In this embodiment, since the base substrate can be selected, a light-transmitting substrate or the like can be employed as appropriate in accordance with the purpose of use. Thus, a semiconductor device having various functions can be provided by using the present invention.

This embodiment can be implemented in appropriate combination with the structures described in the other embodiments.

Embodiment 4

In this embodiment, an example of a transistor that can be applied to a semiconductor device disclosed in this specification will be described. There is no particular limitation on the structure of the transistor that can be applied to a semiconductor device disclosed in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel region with a gate insulating layer provided therebetween.

FIGS. 8A to 8D each illustrate an example of a cross-sectional structure of a transistor that can be applied to a semiconductor device disclosed in this specification (for example, the transistor 162 in Embodiments 2 and 3). In each of FIGS. 8A to 8D, the transistor is provided over an insulating layer 400; however, the transistor may be provided over a substrate such as a glass substrate. Note that in the case where any of the transistors illustrated in FIGS. 8A to 8D is applied to the transistor 162 in Embodiments 2 and 3, the insulating layer 400 corresponds to the insulating layer 130.

Figure 8A:
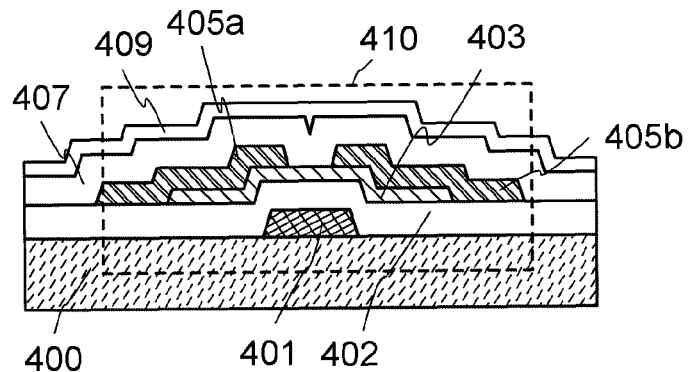
FIGS. 8A to 8D each illustrate one embodiment of a semiconductor device.

A transistor 410 illustrated in FIG. 8A is a kind of bottom-gate thin film transistor, and is also referred to as an inverted-staggered thin film transistor.

The transistor 410 includes, over the insulating layer 400, a gate electrode layer 401, a gate insulating layer 402, a semiconductor layer 403, a source electrode layer 405a, and a drain electrode layer 405b. An insulating layer 407 covering the transistor 410 is stacked over the semiconductor layer 403. An insulating layer 409 is formed over the insulating layer 407.

Figure 8B:
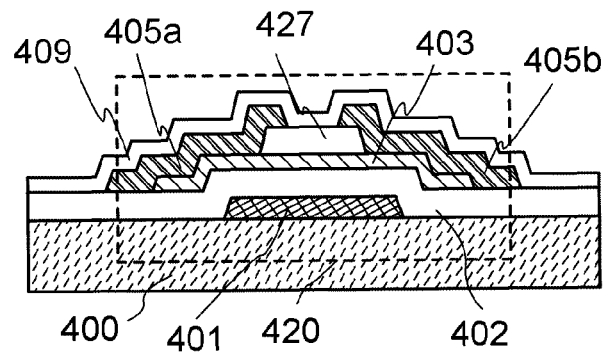

A transistor 420 illustrated in FIG. 8B has a kind of bottom-gate structure referred to as a channel-protective type (channel-stop type) and is also referred to as an inverted-staggered thin film transistor.

The transistor 420 includes, over the insulating layer 400, the gate electrode layer 401, the gate insulating layer 402, the semiconductor layer 403, an insulating layer 427 functioning as a channel protective layer which covers a channel formation region of the semiconductor layer 403, the source electrode layer 405*a*, and the drain electrode layer 405*b*. The insulating layer 409 is formed to cover the transistor 420.

Figure 8C:
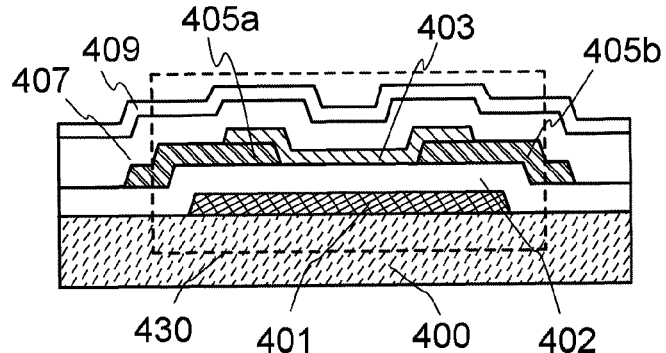

A transistor 430 illustrated in FIG. 8C is a bottom-gate thin film transistor and includes, over the insulating layer 400, the gate electrode layer 401, the gate insulating layer 402, the source electrode layer 405*a*, the drain electrode layer 405*b*, and the semiconductor layer 403. In addition, the insulating layer 407 covering the transistor 430 is provided in contact with the semiconductor layer 403. The insulating layer 409 is formed over the insulating layer 407.

In the transistor 430, the gate insulating layer 402 is provided on and in contact with the insulating layer 400 and the gate electrode layer 401, and the source electrode layer 405*a* and the drain electrode layer 405*b* are provided on and in contact with the gate insulating layer 402. Further, the semiconductor layer 403 is provided over the gate insulating layer 402, the source electrode layer 405*a*, and the drain electrode layer 405*b*.

Figure 8D:
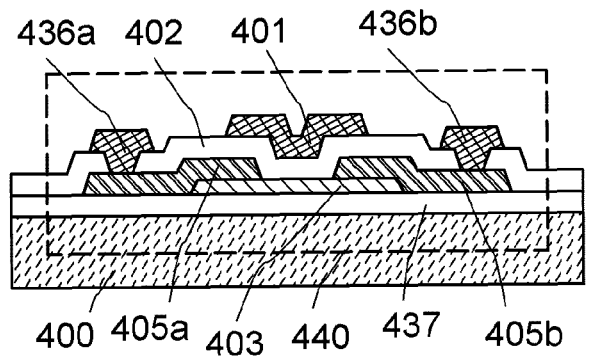

A transistor 440 illustrated in FIG. 8D is a kind of top-gate thin film transistor. The transistor 440 includes, over the insulating layer 400, an insulating layer 437, the semiconductor layer 403, the source electrode layer 405*a*, the drain electrode layer 405*b*, the gate insulating layer 402, and the gate electrode layer 401. A wiring layer 436*a* and a wiring layer 436*b* are provided in contact with and electrically connected to the source electrode layer 405*a* and the drain electrode layer 405*b* respectively.

In the case of forming each of the bottom-gate transistors 410, 420, and 430 over a substrate, an insulating film serving as a base film may be provided between the substrate and the gate electrode layer. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The gate electrode layer 401 can be formed with a single-layer structure or a stacked-layer structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, by a plasma CVD method, a silicon nitride layer ($SiN_y$ (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As the conductive film used for the source electrode layer 405*a* and the drain electrode layer 405*b*, for example, a film of an element selected from Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that for the source electrode layer 405*a* and the drain electrode layer 405*b* can be used for a conductive film used for the wiring layer 436*a* and the wiring layer 436*b* which are respectively connected to the source electrode layer 405*a* and the drain electrode layer 405*b*.

Alternatively, the conductive film to be the source and drain electrode layers 405*a* and 405*b* (including a wiring layer formed using the same layer as the source and drain electrode layers) may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

As the insulating layers 407, 427, and 437, an inorganic insulating film, typical examples of which are a silicon oxide film, a silicon oxynitride film, an aluminum oxide film, and an aluminum oxynitride film, can be used.

As the insulating layer 409, an inorganic insulating film such as a silicon nitride film, an aluminum nitride film, a silicon nitride oxide film, or an aluminum nitride oxide film can be used.

In addition, a planarization insulating film may be formed over the insulating layer 409 in order to reduce surface unevenness due to the transistor. As the planarization insulating film, an organic material such as polyimide, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed using any of these materials.

This embodiment can be implemented in appropriate combination with the structures described in the other embodiments.

Embodiment 5

An oxide semiconductor will be described as an example which can be used for the semiconductor layers of the transistors in Embodiments 2 to 4.

In the transistors 410, 420, 430, and 440 illustrated in FIGS. 8A to 8D of Embodiment 4, an oxide semiconductor layer can be used as the semiconductor layer 403.

As an oxide semiconductor used for the semiconductor layer 403, the following can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O- based oxide semiconductor, or a Sn—Al—Zn—O-based oxide semiconductor, which is a three-component metal oxide; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material, which is a two-component metal oxide; an In—O-based oxide semiconductor, a Sn—O-based oxide semiconductor, a Zn—O-based oxide semiconductor; or the like. Further, $SiO_2$ may be contained in the above oxide semiconductor. In this specification, for example, an In—Ga—Zn—O-based oxide semiconductor means an oxide film containing indium (In), gallium (Ga), and zinc (Zn), and there is no particular limitation on the composition ratio. The In—Ga—Zn—O-based oxide semiconductor may contain an element other than In, Ga, and Zn.

For the oxide semiconductor layer, a thin film expressed by a chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, the atomic ratio thereof is In/Zn=0.5 to 50, preferably In/Zn=1 to 20, further preferably In/Zn=1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

As the oxide semiconductor used for the semiconductor layer 403, an oxide semiconductor including indium, an oxide semiconductor including indium and gallium, or the like can be favorably used.

In addition, in the case of using an oxide semiconductor for the semiconductor layer 403, a metal oxide film is preferably used as a film in contact with the semiconductor layer 403. Metal oxide films each containing the same kind of component as an oxide semiconductor layer may be provided with the oxide semiconductor layer provided therebetween, which is effective for prevention of variation in the electrical characteristics. As the metal oxide film containing the same kind of component as the oxide semiconductor layer, specifically, a film containing an oxide of one or more metal elements selected from constituent elements of the oxide semiconductor layer is preferably used. Such a material is compatible with the oxide semiconductor layer, and therefore, provision of the metal oxide films with the oxide semiconductor layer provided therebetween enables the interface between the metal oxide film and the oxide semiconductor layer to be kept well. That is, by providing the metal oxide film using the above-described material as an insulating film which is in contact with the oxide semiconductor layer, accumulation of hydrogen ions at the interface between the metal oxide film and the oxide semiconductor layer and in the vicinity thereof can be suppressed or prevented.

The film in contact with the semiconductor layer 403, to which the above metal oxide film can favorably be applied, includes the insulating layer 130 and the gate insulating layer 146 in the transistor 162 of FIGS. 4A to 4C, the gate insulating layer 402 and the insulating layer 407 in the transistors 410 and 430 of FIGS. 8A and 8C, the gate insulating layer 402 and the insulating layer 427 in the transistor 420 of FIG. 8B, and the insulating layer 437 and the gate insulating layer 402 in the transistor 440 of FIG. 8D. The gate insulating layer 402, the insulating layer 407, the insulating layer 427, and the insulating layer 437 may each have a stacked-layer structure. In that case, it is preferable that at least the film in contact with the semiconductor layer 403 be a metal oxide film.

The metal oxide film is formed using a material such as silicon oxide, silicon nitride, silicon oxynitride, or silicon nitride oxide, for example. Alternatively, a material including a Group 13 element and oxygen can be used. Examples of the material including a Group 13 element and oxygen are a material including one or more of gallium oxide, aluminum oxide, aluminum gallium oxide, and gallium aluminum oxide; and the like. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent. The metal oxide film can be formed with a single-layer structure or a stacked-layer structure using the above-described materials.

Note that many oxide semiconductor materials that can be used for forming an oxide semiconductor layer include a Group 13 element. Therefore, by formation of a film in contact with the oxide semiconductor layer with the use of a material including a Group 13 element and oxygen, the interface state between the oxide semiconductor layer and the film in contact with the oxide semiconductor layer can be kept well. This is because the material including a Group 13 element and oxygen is compatible with the oxide semiconductor material.

For example, in the case of forming an oxide semiconductor layer containing gallium, a material including gallium oxide is used for the film in contact with the oxide semiconductor layer, whereby interface characteristics between the oxide semiconductor layer and the film in contact with the oxide semiconductor layer can be kept well. For example, the oxide semiconductor layer and an insulating film containing gallium oxide are provided in contact with each other, so that pile up of hydrogen at an interface between the oxide semiconductor layer and the insulating film can be reduced. Note that when an element belonging to the same group as the constituent element of the oxide semiconductor is used, a similar effect can be obtained. That is to say, it is also effective to form the film in contact with the oxide semiconductor layer using a material including aluminum oxide or the like. Aluminum oxide has a property of not easily transmitting water. Thus, it is preferable to use the material including aluminum oxide in terms of preventing entry of water to the oxide semiconductor layer.

Note that two or more Group 13 elements may be contained in the film in contact with the oxide semiconductor layer. For example, a material such as the above-mentioned aluminum gallium oxide (or gallium aluminum oxide) including gallium and aluminum may be used for the film in contact with the oxide semiconductor layer. In this case, an effect brought about by inclusion of gallium and an effect brought about by inclusion of aluminum can both be obtained, which is preferable. For example, the oxide semiconductor layer and an insulating film containing aluminum gallium oxide are provided in contact with each other, so that water can be prevented from entering the oxide semiconductor layer and pile up of hydrogen at an interface between the oxide semiconductor layer and the insulating film can be sufficiently reduced.

Furthermore, the film in contact with the oxide semiconductor layer preferably includes a region where the amount of oxygen is larger than that in the stoichiometric composition ratio. Thus, oxygen can be supplied to the oxide semiconductor layer, and oxygen deficiency defects in the oxide semiconductor layer and at the interface between the oxide semiconductor layer and the film in contact with the oxide semiconductor layer can be reduced.

In the case where an oxide semiconductor with no defects (oxygen vacancies) is used, the amount of oxygen contained in the film in contact with the oxide semiconductor layer may be equal to that in the stoichiometric composition. However, in order to secure reliability, for example, to suppress variation in the threshold voltage of a transistor, it is preferable that the film in contact with the oxide semiconductor layer contain oxygen whose amount is larger than that in the stoichiometric composition, considering the possibility of an oxygen vacancy being caused in the oxide semiconductor layer.

A specific example of a structure of the film in contact with the oxide semiconductor layer will be described using the transistor 440. In the transistor 440, the films in contact with the semiconductor layer 403 which is an oxide semiconductor layer are the insulating layer 437 and the gate insulating layer 402. Note that an In—Ga—Zn—O film is used as the semiconductor layer 403.

A first example is an example in which a gallium oxide ($Ga_2O_x$ ($x=3+\alpha$, $0<\alpha<1$)) film is used as the insulating layer 437 and the gate insulating layer 402. The insulating layer 437 and the gate insulating layer 402 may each have a stacked-layer structure in which a gallium oxide ($Ga_2O_x$ ($x=3+\alpha$, $0<\alpha<1$)) film is provided in contact with the semiconductor layer 403 and a gallium aluminum oxide ($Ga_xAl_{2-x}O_{3+\alpha}$ ($0<x\leq2$, $0<\alpha<1$)) film is provided in contact with and outside the gallium oxide film.

A second example is an example in which an aluminum oxide ($Al_2O_x$ ($x=3+\alpha$, $0<\alpha<1$)) film is used as the insulating layer 437 and the gate insulating layer 402. One of the insulating layer 437 and the gate insulating layer 402 may be a gallium oxide ($Ga_2O_x$ ($x=3+\alpha$, $0<\alpha<1$)) film.

A third example is an example in which a film of gallium aluminum oxide or aluminum gallium oxide ($Ga_xAl_{2-x}O_{3+\alpha}$ ($0<x<2$, $0<\alpha<1$)) is used as the insulating layer 437 and the gate insulating layer 402. The insulating layer 437 and the gate insulating layer 402 may each have a stacked-layer structure in which a gallium aluminum oxide ($Ga_xAl_{2-x}O_{3+\alpha}$ ($1<x<2$, $0<\alpha<1$)) film is provided in contact with the semiconductor layer 403 and an aluminum gallium oxide ($Ga_xAl_{2-x}O_{3+\alpha}$ ($0<x<1$, $0<\alpha<1$)) film is provided in contact with and outside the gallium aluminum oxide film.

With the above structure, the semiconductor device can have higher reliability.

In the transistors 410, 420, 430, and 440 each including an oxide semiconductor layer, the current value in an off-state (off-state current value) can be reduced.

In addition, the transistors 410, 420, 430, and 440 each including an oxide semiconductor layer as the semiconductor layer 403 can operate at high speed because relatively high field-effect mobility can be obtained.

This embodiment can be implemented in appropriate combination with the structures described in the other embodiments.

Embodiment 6

In this embodiment, an example of a method for manufacturing an oxide semiconductor layer which can be used as a semiconductor layer of a transistor will be described. The same portions as or portions having functions similar to those in the above embodiments can be formed in a manner similar to those described in the above embodiments, and thus repetitive description is omitted. In addition, detailed description of the same portions is not repeated.

An oxide semiconductor used for a semiconductor layer in this embodiment is made to be an i-type (intrinsic) oxide semiconductor or made to be extremely close to an i-type (intrinsic) oxide semiconductor by being highly purified by removing hydrogen, which is an n-type impurity, from an oxide semiconductor so that impurities that are not main components of the oxide semiconductor are contained as little as possible. In other words, a feature is that a highly purified i-type (intrinsic) semiconductor or a semiconductor close thereto is obtained not by adding an impurity but by removing an impurity such as hydrogen or water as much as possible. This enables the Fermi level ($E_f$) to be at the same level as the intrinsic Fermi level (Ei). Thus, an oxide semiconductor layer included in a transistor is highly purified to become electrically i-type (intrinsic).

In addition, a highly purified oxide semiconductor includes extremely few carriers (close to zero), and the carrier concentration thereof is lower than $1\times10^{14}/cm^3$, preferably lower than $1\times10^{12}/cm^3$, further preferably lower than $1\times10^{11}/cm^3$.

Since the oxide semiconductor includes extremely few carriers, off-state current can be reduced in a transistor. The smaller the amount of off-state current is, the better.

Specifically, in a transistor including the above oxide semiconductor layer, the current value (off-state current value) in an off state (per unit channel width (1 μm) here) at room temperature (25° C.) can be 100 zA (1 zA (zeptoampere) is $1\times10^{-21}$ A) or less, preferably 10 zA or less.

Further, the temperature dependence of on-state current can hardly be observed and the off-state current remains very low in the transistor including the above oxide semiconductor layer. Further, transistor characteristics hardly change due to light deterioration.

In order that hydrogen, a hydroxyl group, and moisture are contained as little as possible in the oxide semiconductor film, it is preferable that the substrate be preheated in a preheating chamber of a sputtering apparatus as pretreatment before formation of the oxide semiconductor film, so that impurities such as hydrogen or moisture adsorbed onto the substrate are eliminated and removed. As an exhaustion unit provided in the preheating chamber, a cryopump is preferable. Note that this preheating treatment can be omitted.

The thickness of the oxide semiconductor film may be greater than or equal to 2 nm and less than or equal to 200 nm, preferably greater than or equal to 5 nm and less than or equal to 30 nm.

Note that before the oxide semiconductor film is formed by a sputtering method, powdery substances (also referred to as particles or dust) attached on a surface where the oxide semiconductor film is to be formed are preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

As an oxide semiconductor used for the oxide semiconductor film, an oxide semiconductor described in Embodiment 5, such as a four-component metal oxide, a three-component metal oxide, a two-component metal oxide, an In—O-based oxide semiconductor, a Sn—O-based oxide semiconductor, or a Zn—O-based oxide semiconductor can be used. Further, SiO$_2$ may be contained in the above oxide semiconductor. In this embodiment, the oxide semiconductor film is formed by a sputtering method with the use of an In—Ga—Zn—O-based oxide target. Further, the oxide semiconductor film can be formed by a sputtering method in a rare gas (typically, argon) atmosphere, an oxygen atmosphere, or a mixed atmosphere of a rare gas and oxygen.

A target used for the formation of the oxide semiconductor film by a sputtering method is, for example, an oxide target containing In$_2$O$_3$, Ga$_2$O$_3$, and ZnO at a composition ratio of 1:1:1 [molar ratio], so that an In—Ga—Zn—O film is formed. Without limitation to the material and the composition of the target, for example, an oxide target having a composition ratio of In$_2$O$_3$:Ga$_2$O$_3$:ZnO=1:1:2 [molar ratio] may be used. The filling rate of the oxide target is higher than or equal to 90% and lower than or equal to 100%, preferably, higher than or equal to 95% and lower than or equal to 99.9%. With the use of a metal oxide target with high filling rate, the deposited oxide semiconductor film has high density.

It is preferable that a high-purity gas from which impurities such as hydrogen, water, a hydroxyl group, or hydride have been removed be used as a sputtering gas used for forming the oxide semiconductor film.

The substrate is held in a deposition chamber kept under reduced pressure, and the substrate temperature is set to temperatures higher than or equal to 100° C. and lower than or equal to 600° C., preferably higher than or equal to 200° C. and lower than or equal to 400° C. By forming the oxide semiconductor film in a state where the substrate is heated, the concentration of impurities in the formed oxide semiconductor film can be reduced. In addition, damage by sputtering can be reduced. Then, moisture remaining in the deposition chamber is removed, a sputtering gas from which hydrogen and moisture are removed is introduced, and the above-described target is used, so that the oxide semiconductor film is formed. In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with the cryopump, a hydrogen atom, a compound containing a hydrogen atom, such as water (H$_2$O), (preferably, also a compound containing a carbon atom), and the like are removed, whereby the concentration of impurities in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferably used, in which case powder substances (also referred to as particles or dust) that are generated in deposition can be reduced and the film thickness can be uniform.

Next, the oxide semiconductor film is processed into an island-shaped oxide semiconductor layer in a photolithography step. A resist mask for forming the island-shaped oxide semiconductor layer may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used.

Then, the oxide semiconductor layer is subjected to heat treatment for dehydration or dehydrogenation. The temperature of the heat treatment for dehydration or dehydrogenation is higher than or equal to 400° C. and lower than or equal to 750° C., or higher than or equal to 400° C. and lower than the strain point of the substrate. Here, the substrate is put in an electric furnace that is a kind of heat treatment apparatus and heat treatment is performed on the oxide semiconductor layer at 450° C. for one hour in a nitrogen atmosphere, and then the oxide semiconductor layer is kept without being exposed to the air so that water and hydrogen are prevented from entering the oxide semiconductor layer; thus, the oxide semiconductor layer is obtained.

The heat treatment apparatus is not limited to an electric furnace, and a device for heating an object to be processed by heat conduction or heat radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the heat treatment for dehydration or dehydrogenation can employ GRTA, in which the substrate is moved into an inert gas heated to a high temperature of 650° C. to 700° C., and heated for several minutes there, and then the substrate is moved out of the inert gas heated to a high temperature.

Note that it is preferable that in the heat treatment for dehydration or dehydrogenation, water, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the concentration of impurities is 1 ppm or lower, preferably 0.1 ppm or lower).

After the oxide semiconductor layer is heated in the heat treatment for dehydration or dehydrogenation, a high-purity oxygen gas, a high-purity N$_2$O gas, or ultra-dry air (having a dew point of −40° C. or lower, preferably −60° C. or lower) may be introduced into the same furnace. It is preferable that the oxygen gas and the N$_2$O gas do not include water, hydrogen, and the like. The purity of the oxygen gas or the N$_2$O gas that is introduced into the heat treatment apparatus is preferably 6N or higher, further preferably 7N or higher (i.e., the concentration of impurities in the oxygen gas or the N$_2$O gas is 1 ppm or lower, preferably 0.1 ppm or lower). Oxygen which is a main component of an oxide semiconductor and has been reduced at the same time as the step of removing impurities through the dehydration or the dehydrogenation is supplied by the action of the oxygen gas or the N$_2$O gas, whereby the purity of the oxide semiconductor layer is increased and the oxide semiconductor layer is made to be electrically i-type (intrinsic).

In addition, the heat treatment for dehydration or dehydrogenation of the oxide semiconductor layer may be performed on the oxide semiconductor film which has not been processed into an island-shaped oxide semiconductor layer. In that case, after the heat treatment for dehydration or dehydrogenation, the substrate is taken out from the heat treatment apparatus and a photolithography step is performed.

In the case of a top-gate transistor such as the transistor 162 in FIGS. 4A to 4C, the heat treatment for dehydration or dehydrogenation may be performed after a source electrode layer and a drain electrode layer are formed over an oxide semiconductor layer.

In addition, as the oxide semiconductor layer, an oxide semiconductor layer having a crystal region with a large thickness (a single crystal region), that is, a crystal region which is c-axis-aligned perpendicularly to a surface of the film may be formed by performing deposition twice and heat treatment twice, regardless of a material of a base component such as an oxide, a nitride, or a metal. For example, a first oxide semiconductor film with a thickness of greater than or equal to 3 nm and less than or equal to 15 nm is formed and then first heat treatment is performed at temperatures higher than or equal to 450° C. and lower than or equal to 850° C., preferably higher than or equal to 550° C. and lower than or equal to 750° C. in an atmosphere of nitrogen, oxygen, a rare gas, or dry air, whereby a first oxide semiconductor film which includes a crystalline region (including plate-like crystals) in a region including its surface is formed. Then, a second oxide semiconductor film which is thicker than the first oxide semiconductor film is formed and then second heat treatment is performed at temperatures higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth, whereby the whole second oxide semiconductor film is crystallized. In such a manner, an oxide semiconductor layer which includes a thick crystalline region may be formed.

Next, by plasma treatment using a gas such as $N_2O$, $N_2$, or Ar, water or the like adsorbed to a surface of an exposed portion of the oxide semiconductor layer may be removed. In the case where the plasma treatment is performed, an insulating layer containing oxygen is formed in contact with the oxide semiconductor layer without being exposed to the air.

It is preferable that any of the metal oxide films described in Embodiment 5 be used as the insulating layer in contact with the oxide semiconductor layer.

It is important that a formation method in which hydrogen is not used be employed so that the insulating layer in contact with the oxide semiconductor layer contains as little hydrogen as possible. Therefore, it is preferable that a high-purity gas from which impurities such as hydrogen, water, a hydroxyl group, or hydride have been removed be used as a deposition gas for the formation of the insulating layer.

After the insulating layer is formed in contact with the oxide semiconductor layer, heat treatment is performed with the oxide semiconductor layer and the insulating layer in contact with each other. The heat treatment (preferably, at higher than or equal to 200° C. and lower than or equal to 400° C., for example, higher than or equal to 250° C. and lower than or equal to 350° C.) can be performed in an inert gas atmosphere or in an oxygen gas atmosphere. For example, the heat treatment is performed at 250° C. for one hour in a nitrogen atmosphere.

Through the above steps, the heat treatment is performed on the oxide semiconductor film so that impurities such as hydrogen, moisture, a hydroxyl group, and hydride (also referred to as a hydrogen compound) are intentionally removed from the oxide semiconductor layer. Additionally, oxygen which is one of main components of the oxide semiconductor and is reduced at the same time as the step of removing impurities can be supplied. Accordingly, the oxide semiconductor layer is highly purified to be an electrically i-type (intrinsic) semiconductor.

As described above, the transistor including the highly purified oxide semiconductor layer, which is manufactured in accordance with this embodiment, is used, whereby the current value in an off state (off-state current value) can be further reduced.

In addition, since the transistor including the highly purified oxide semiconductor layer has high field-effect mobility, high-speed operation is possible.

This embodiment can be implemented in appropriate combination with the structures described in the other embodiments.

Embodiment 7

An example of another material which can be used for the semiconductor layers of the transistors in Embodiments 2 to 4 will be described.

A semiconductor layer included in a semiconductor element can be formed using any of the following materials: an amorphous semiconductor (hereinafter also referred to as an "AS") formed by a vapor deposition method using a semiconductor material gas typified by silane or germane or by a sputtering method; a polycrystalline semiconductor formed by crystallizing the amorphous semiconductor by utilizing light energy or thermal energy; a microcrystalline semiconductor; and the like. The semiconductor layer can be formed by a sputtering method, an LPCVD method, a plasma CVD method, or the like.

The microcrystalline semiconductor film can be formed by a high-frequency plasma CVD method with a frequency of several tens of megahertz to several hundreds of megahertz or a microwave plasma CVD apparatus with a frequency of 1 GHz or higher. Typically, the microcrystalline semiconductor film can be formed using silicon hydride such as $SiH_4$, $Si_2H_6$, $SiH_2Cl_2$, $SiHCl_3$, $SiCl_4$, or $SiF_4$, which is diluted with hydrogen. With a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is 5:1 to 200:1, preferably 50:1 to 150:1, further preferably 100:1.

A typical example of an amorphous semiconductor is hydrogenated amorphous silicon, while a typical example of a crystalline semiconductor is polysilicon and the like. Examples of polysilicon (polycrystalline silicon) include so-called high-temperature polysilicon which contains polysilicon formed at a process temperature of 800° C. or higher as the main component, so-called low-temperature polysilicon which contains polysilicon formed at a process temperature of 600° C. or lower as the main component, polysilicon obtained by crystallizing amorphous silicon by using an element that promotes crystallization or the like, and the like. Needless to say, as described above, a microcrystalline semiconductor, or a semiconductor which includes a crystalline phase in part of a semiconductor layer can be used.

In the case of using a crystalline semiconductor film for the semiconductor layer, the crystalline semiconductor film may be formed by various methods (such as a laser crystallization method, a thermal crystallization method, or a thermal crystallization method using an element that promotes crystallization, such as nickel). Further, when a microcrystalline semiconductor that is SAS is crystallized by laser irradiation, crystallinity thereof can be enhanced. In the case where an element which promotes crystallization is not used, before an amorphous silicon film is irradiated with a laser light, the amorphous silicon film is heated at 500° C. for one hour in a nitrogen atmosphere so that the concentration of hydrogen contained in the amorphous silicon film becomes lower than or equal to $1 \times 10^{20}$ atoms/cm$^3$. This is because, if the amorphous silicon film contains much hydrogen, the amorphous silicon film would be destroyed by laser irradiation.

There is no particular limitation on a method for introducing a metal element into an amorphous semiconductor film as long as the metal element can exist on the surface of or inside the amorphous semiconductor film. For example, a sputtering method, a CVD method, a plasma processing method (including a plasma CVD method), an adsorption method, or a method of applying a metal-salt solution can be employed. Among them, the method using a solution is simple and advantageous in that the concentration of the metal element can be easily controlled. At this time, an oxide film is preferably formed by UV light irradiation in an oxygen atmosphere, thermal oxidation, treatment with ozone water or hydrogen peroxide including a hydroxyl radical, or the like in order to improve the wettability of the surface of the amorphous semiconductor film and to spread an aqueous solution on the entire surface of the amorphous semiconductor film.

In a crystallization step in which an amorphous semiconductor film is crystallized to form a crystalline semiconductor film, an element which promotes crystallization (also referred to as a catalytic element or a metal element) may be added to the amorphous semiconductor film, and crystallization may be performed by heat treatment (at 550° C. to 750° C. for 3 minutes to 24 hours). As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element that promotes crystallization from the crystalline semiconductor film, a semiconductor film containing an impurity element is formed in contact with the crystalline semiconductor film so as to function as a gettering sink. The impurity element may be an impurity element imparting n-type conductivity, an impurity element imparting p-type conductivity, a noble gas element, or the like. For example, one or more elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor film containing a rare gas element is formed in contact with the crystalline semiconductor film containing the element that promotes crystallization, and then heat treatment is performed (at 550° C. to 750° C. for 3 minutes to 24 hours). The element which promotes crystallization contained in the crystalline semiconductor film moves into the semiconductor film containing a rare gas element, and thus, the element which promotes crystallization contained in the crystalline semiconductor film is removed or reduced. After that, the semiconductor film containing a rare gas element, which serves as the gettering sink, is removed.

The amorphous semiconductor film may be crystallized by a combination of heat treatment and laser light irradiation. Alternatively, either heat treatment or laser light irradiation may be performed plural times.

A crystalline semiconductor film may be formed directly over a substrate by a plasma method. Alternatively, a crystalline semiconductor film may be selectively formed over the substrate by a plasma method.

This embodiment can be implemented in appropriate combination with the structures described in the other embodiments.

Embodiment 8

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

In this embodiment, examples of an electronic device on which a transistor with favorable electric characteristics and high reliability which can be obtained in any of the above embodiments is mounted will be described with reference to FIGS. 9A to 9E.

Figure 9A:
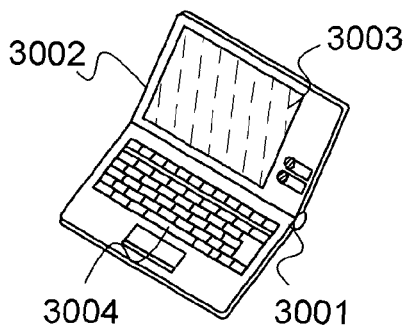
FIGS. 9A to 9E illustrate electronic devices.

FIG. 9A is a laptop personal computer, which includes a main body 3001, a housing 3002, a display portion 3003, a keyboard 3004, and the like. The connection structure of conductive layers described in the above embodiment is applied to the laptop personal computer, so that a laptop personal computer with favorable quality and high reliability can be realized.

Figure 9D:
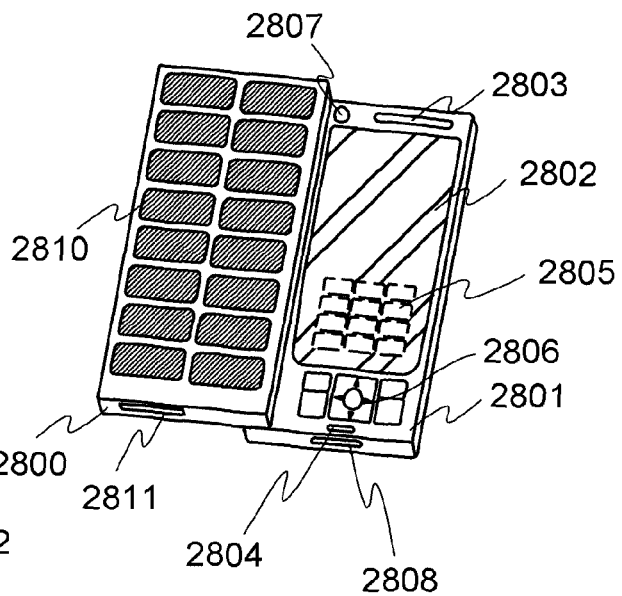
Figure 9B:
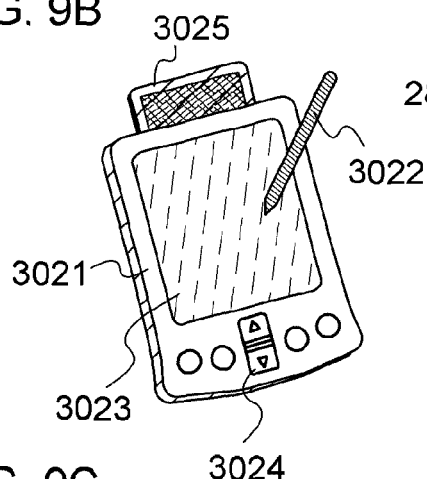

FIG. 9B is a portable information terminal (PDA), which includes a display portion 3023, an external interface 3025, an operation button 3024, and the like in a main body 3021. A stylus 3022 is included as an accessory for operation. The connection structure of conductive layers described in the above embodiment is applied to the portable information terminal (PDA), so that a portable information terminal (PDA) with favorable quality and high reliability can be realized.

Figure 9E:
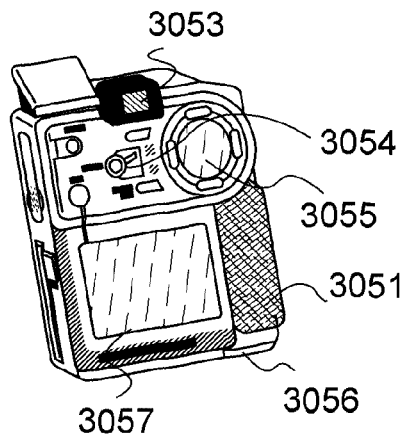
Figure 9C:
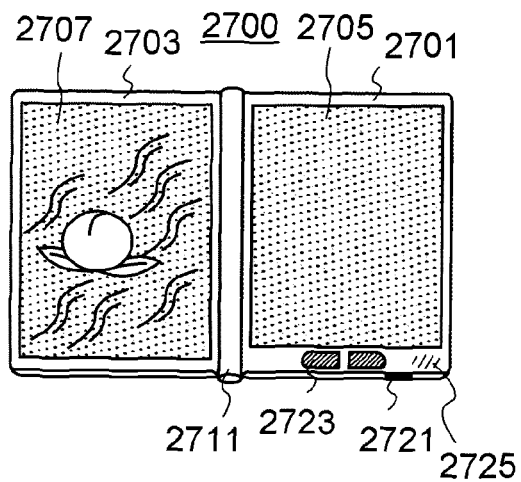

FIG. 9C is an e-book reader manufactured by mounting an electronic paper which is an example of a semiconductor device according to one embodiment of the present invention as a component. FIG. 9C is an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG.

9C) can display text and a display portion on the left side (the display portion 2707 in FIG. 9C) can display graphics.

Further, FIG. 9C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 9D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar cell 2810 for charging of the portable information terminal, an external memory slot 2811, and the like. Further, an antenna is incorporated in the housing 2801. The connection structure of conductive layers described in the above embodiment is applied to the mobile phone, so that the mobile phone can have high reliability.

Further, the display panel 2802 is provided with a touch panel. A plurality of operation keys 2805 that is displayed as images is illustrated by dashed lines in FIG. 9D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved. As the storage medium, the semiconductor device described in Embodiment 2 or 3 can be used. According to Embodiment 2 or 3, a highly reliable semiconductor device which can store data for a long time can be obtained.

Further, in addition to the above functions, an infrared communication function, a television reception function, or the like may be provided.

FIG. 9E is a digital camera which includes a main body 3051, a display portion (A) 3057, an eyepiece 3053, operation switches 3054, a display portion (B) 3055, a battery 3056, and the like. The connection structure of conductive layers described in the above embodiment is applied to the digital camera, so that a digital camera with favorable quality and high reliability can be realized.

As described above, the electronic devices described in this embodiment each include the semiconductor device according to any of the above embodiments. Therefore, electronic devices having favorable qualities can be realized.

Example 1

Figure 10A:
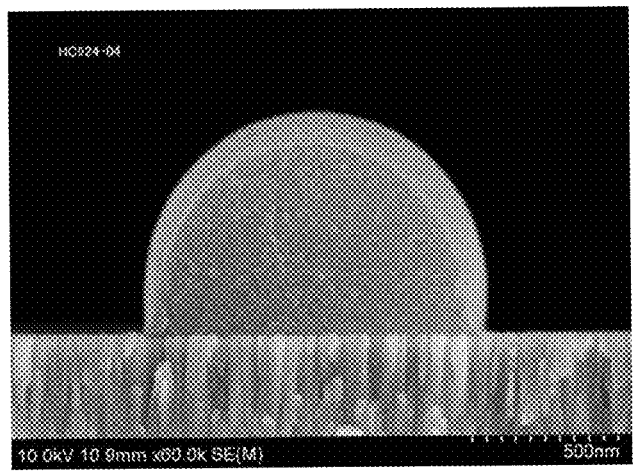
FIGS. 10A and 10B show respectively a SEM image and a STEM image in an example.
Figure 10B:
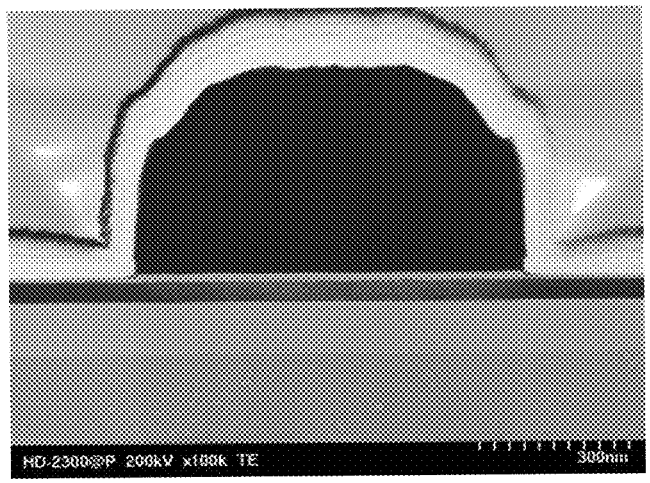

In this example, a conductive layer that can be used in a semiconductor device which is one embodiment of the present invention was manufactured, and was observed using a scanning electron microscope (SEM) and a scanning transmission electron microscope (STEM). FIGS. 10A and 10B show a SEM image (magnified 60000 times) and a STEM image (magnified 100000 times), respectively.

FIG. 10B shows a conductive layer of this example, and FIG. 10A shows a resist mask which was used to form the conductive layer in FIG. 10B.

A resist mask was formed to have a tapered shape, and then was subjected to heat treatment at 180° C. for two hours; thus, the resist mask having a curved surface shown in FIG. 10A, whose cross-sectional shape is almost a semi-circle according to the STEM image was able to be obtained. As a resist material, TSMR-8900MD2 (manufactured by Tokyo Ohka Kogyo Co., Ltd.) was used.

A conductive layer having a stacked-layer structure of a tantalum nitride film and a tungsten film was etched using the resist mask having a curved surface shown in FIG. 10A, whereby the conductive layer having a curved surface shown in FIG. 10B was able to be formed.

In this example, the conductive layer was formed by stacking of a tantalum nitride film (with a thickness of 30 nm) and a tungsten film (with a thickness of 370 nm) by a sputtering method, and was subjected to two etching steps: a first etching step and a second etching step. The first etching step was performed under the following conditions: carbon tetrafluoride ($CF_4$), chlorine ($Cl_2$), and oxygen ($O_2$) ($CF_4:Cl_2:O_2$=60 sccm:50 sccm:45 sccm) were used as an etching gas, the electric power was 3000 W, the bias power was 100 W, the pressure was 0.67 Pa, and the substrate temperature was −10° C. The second etching step was performed under the following conditions: chlorine ($Cl_2$) ($Cl_2$=100 sccm) was used as an etching gas, the electric power was 2000 W, the bias power was 50 W, the pressure was 0.67 Pa, and the substrate temperature was −10° C.

The conductive layer in FIG. 10B reflects the shape of the resist mask in FIG. 10A, and has a curved surface without steep unevenness or a steep step.

The top of the conductive layer of this example shown in FIG. 10B has a curved surface, so that coverage with another conductive layer stacked thereover can be favorable.

A conductive layer in an upper layer is formed over a conductive layer in a lower layer with good coverage, whereby electric connection between the conductive layers can be ensured. Therefore, poor characteristics due to a defect in the shape of a film can be suppressed in manufacturing, so that yield is improved, and reliability of the semiconductor device can be improved.

EXPLANATION OF REFERENCES

106: element isolation insulating layer, 108: gate insulating layer, 110: gate electrode, 116: channel formation region, 120: impurity region, 124: metal compound region, 128: insulating layer, 130: insulating layer, 140: transistor, 142*a*:

source electrode or drain electrode, 142b: source electrode or drain electrode, 144: semiconductor layer, 146: gate insulating layer, 148a: gate electrode, 148b: electrode, 150: insulating layer, 152: insulating layer, 156: wiring, 162: transistor, 164: capacitor, 170: insulating layer, 171: insulating layer, 180: base substrate, 181: channel formation region, 182: impurity region, 183: insulating layer, 184: semiconductor layer, 185: substrate, 190: single crystal semiconductor substrate, 191: hydrogen ion, 192: embrittled region, 193: insulating layer, 194: single crystal semiconductor layer, 200: insulating layer, 201: conductive layer, 202: conductive layer, 203: insulating layer, 204: insulating layer, 211: conductive film, 212: resist mask, 213: insulating layer, 300: insulating layer, 301a: conductive layer, 301b: conductive layer, 301c: conductive layer, 301d: conductive layer, 302a: conductive layer, 302b: conductive layer, 302c: conductive layer, 302d: conductive layer, 303a: insulating layer, 303b: insulating layer, 303c: insulating layer, 400: insulating layer, 401: gate electrode layer, 402: gate insulating layer, 403: semiconductor layer, 405a: source electrode layer, 405b: drain electrode layer, 407: insulating layer, 409: insulating layer, 410: transistor, 420: transistor, 427: insulating layer, 430: transistor, 436a: wiring layer, 436b: wiring layer, 437: insulating layer, 440: transistor, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eye piece, 3054: operation switch, 3055: display portion (B), 3056: battery, 3057: display portion (A)

This application is based on Japanese Patent Application serial No. 2010-148134 filed with Japan Patent Office on Jun. 29, 2010, the entire contents of which are hereby incorporated by reference.

The invention claimed is:

1. A semiconductor device comprising:
   a gate electrode layer of a first transistor;
   an insulating layer covering a side surface of the gate electrode layer; and
   a source or a drain electrode layer of a second transistor over and in contact with the insulating layer and with a portion of the gate electrode layer protruded from the insulating layer,
   wherein a surface of the portion of the gate electrode layer protruded from the insulating layer is curved, and
   wherein a surface of another portion of the gate electrode layer protruded from the insulating layer is curved, and the another portion of the gate electrode layer does not touch the source or the drain electrode layer.

2. The semiconductor device according to claim 1, wherein a line width of the gate electrode layer is 1 µm or less.

3. The semiconductor device according to claim 1, wherein the semiconductor device is incorporated in one selected from the group consisting of a laptop personal computer, a portable information terminal, an e-book reader, a mobile phone, and a digital camera.

4. A semiconductor device comprising:
   a gate electrode layer of a first transistor;
   a first insulating layer covering a side surface of the gate electrode layer;
   a second insulating layer over the first insulating layer; and
   a source or a drain electrode layer of a second transistor over and in contact with the second insulating layer and with a portion of the gate electrode layer protruded from the first insulating layer and the second insulating layer,
   wherein a surface of the portion of the gate electrode layer protruded from the first insulating layer and the second insulating layer is curved, and
   wherein a surface of another portion of the gate electrode layer protruded from the first insulating layer and the second insulating layer is curved, and the another portion of the gate electrode layer does not touch the source or the drain electrode layer.

5. The semiconductor device according to claim 4, wherein a line width of the gate electrode layer is 1 µm or less.

6. The semiconductor device according to claim 4, wherein the semiconductor device is incorporated in one selected from the group consisting of a laptop personal computer, a portable information terminal, an e-book reader, a mobile phone, and a digital camera.

* * * * *